United States Patent
Merlin et al.

(10) Patent No.: US 11,165,541 B2
(45) Date of Patent: Nov. 2, 2021

(54) RETRANSMISSION PROTOCOL BASED ON FORWARD ERROR CORRECTION CODEWORDS

(71) Applicant: QUALCOMM Incorporated, San Diego, CA (US)

(72) Inventors: Simone Merlin, San Diego, CA (US); Didier Johannes Richard Van Nee, Tull en 't Waal (NL); Hemanth Sampath, San Diego, CA (US); Bin Tian, San Diego, CA (US); Gwendolyn Denise Barriac, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 74 days.

(21) Appl. No.: 16/672,162

(22) Filed: Nov. 1, 2019

(65) Prior Publication Data

US 2020/0145139 A1    May 7, 2020

Related U.S. Application Data

(60) Provisional application No. 62/755,406, filed on Nov. 2, 2018.

(51) Int. Cl.
| | |
|---|---|
| *H04L 1/18* | (2006.01) |
| *H04L 1/00* | (2006.01) |
| *H04W 80/02* | (2009.01) |
| *H04W 84/12* | (2009.01) |

(52) U.S. Cl.
CPC .......... *H04L 1/1816* (2013.01); *H04L 1/0063* (2013.01); *H04L 1/187* (2013.01); *H04L 1/1874* (2013.01); *H04W 80/02* (2013.01); *H04W 84/12* (2013.01)

(58) Field of Classification Search
CPC ..... H04L 1/1816; H04L 1/0063; H04L 1/187; H04L 1/1874; H04L 1/1864; H04L 1/1812; H04W 80/02; H04W 84/12
See application file for complete search history.

(56) References Cited

U.S. PATENT DOCUMENTS

| | | | |
|---|---|---|---|
| 2017/0230149 A1 | 8/2017 | Wang et al. | |
| 2019/0140784 A1* | 5/2019 | Xi | .......... H04L 1/1845 |
| 2019/0215105 A1* | 7/2019 | Xu | ..... H03M 13/6356 |
| 2019/0253199 A1* | 8/2019 | Young | ........ H04L 1/1819 |
| 2020/0052832 A1* | 2/2020 | Tian | ........... H04L 1/0009 |
| 2020/0220556 A1* | 7/2020 | Usatyuk | ..... H03M 13/6306 |
| 2021/0099253 A1* | 4/2021 | Kim | ........... H04L 1/1607 |

* cited by examiner

*Primary Examiner* — Min Jung
(74) *Attorney, Agent, or Firm* — DeLizio Law, PLLC

(57) ABSTRACT

This disclosure provides systems, methods, and apparatus, including computer programs encoded on computer-readable media, for implementing a retransmission protocol in a wireless local area network (WLAN). The retransmission protocol enables a sending station (STA) to communicate additional parity bits associated with an original transmission that included forward error correction (FEC) encoded codewords. Several techniques are described for a receiving STA to indicate which portions of the original transmission was not properly received. The receiving STA may store the original transmission for use with additional parity bits in a subsequent transmission. The sending STA may communicate the additional parity bits in a subsequent transmission to assist the receiving STA recover the data from the original transmission.

30 Claims, 12 Drawing Sheets

RETRANSMISSION PROTOCOL BASED ON FORWARD ERROR CORRECTION CODEWORDS

CROSS-REFERENCE TO RELATED APPLICATIONS

This Patent Application claims priority to U.S. Provisional Patent Application No. 62/755,406 filed Nov. 2, 2018, entitled "RETRANSMISSION PROTOCOL BASED ON FORWARD ERROR CORRECTION CODEWORDS," and assigned to the assignee hereof. The disclosure of the prior Application is considered part of and is incorporated by reference in this Patent Application.

TECHNICAL FIELD

This disclosure relates to the field of wireless communication, and more particularly to implementing a retransmission protocol based on forward error correction codewords.

DESCRIPTION OF THE RELATED TECHNOLOGY

A wireless local area network (WLAN) may be formed by two or more WLAN devices (which may be referred to as stations, STAs) that share a wireless communication medium using common service settings. One or more of the WLAN devices (which may be referred to as an access point, AP) may establish the common service settings. An AP is a type of STA that performs a distribution system access function in the WLAN.

Wireless communication between two WLAN devices may be unreliable, susceptible to interference or other challenges which impair the wireless communication medium. A retransmission protocol may be used to provide reliable delivery of communications from a first WLAN device (which may be referred to as a sending STA) to a second WLAN device (which may be referred to as a receiving STA). For example, a wireless transmission from a sending STA may include error checking and redundancy information that may enable a receiving STA to discover or correct errors in the wireless transmission. If the errors cannot be corrected, the receiving STA may request a retransmission from the sending STA. A traditional retransmission protocol may include a feedback message to indicate which packets for the sending STA to retransmit. It may be desirable to implement a retransmission protocol that efficiently reduces feedback or retransmission airtime.

SUMMARY

The systems, methods, and devices of this disclosure each have several innovative aspects, no single one of which is solely responsible for the desirable attributes disclosed herein.

Another innovative aspect of the subject matter described in this disclosure can be implemented as a method performed by a first wireless local area network (WLAN) device. The method may include determining that a second WLAN device supports a hybrid automatic repeat request (HARQ) retransmission protocol for managing retransmissions in a wireless local area network. The method may include transmitting, from the first WLAN device to the second WLAN device, an initial HARQ transmission of at least a first media access control (MAC) layer protocol data unit (MPDU). The initial HARQ transmission may include at least a first forward error correction (FEC) codeword having a first set of data bits and a first set of parity bits. The method may include determining that the second WLAN device is unable to decode at least the first FEC codeword. The method may include transmitting a HARQ retransmission from the first WLAN device to a second WLAN device in accordance with the HARQ retransmission protocol, the HARQ retransmission including at least a second set of parity bits corresponding to the first FEC codeword in response to a determination that the second WLAN device is unable to decode the first FEC codeword.

In some implementations, the method may include transmitting a HARQ retransmission policy from the first WLAN device to the second WLAN device.

In some implementations, the method may include transmitting a HARQ capability indicator to the second WLAN device to inform the second WLAN device that the first WLAN device supports the HARQ retransmission protocol.

In some implementations, the initial HARQ transmission is included in a first physical (PHY) layer protocol data unit (PPDU), and the HARQ capability indicator is included in a header of the first PPDU.

In some implementations, the HARQ capability indicator is included in an initialization message for a block acknowledgement protocol.

In some implementations, the method may include receiving a HARQ capability indicator in an initialization message for a block acknowledgement protocol, a MAC layer block acknowledgement message, a codeword block acknowledgement message, or a codeword-specific feedback message.

In some implementations, the method may include determining an FEC codeword buffer window size that corresponds to an available memory of a receiver buffer at the second WLAN device.

In some implementations, the method may include determining parameters for a block acknowledgement protocol, the parameters including a block acknowledgement window size and a maximum MPDU size. The method may include determining the FEC codeword buffer window size based, at least in part, on the parameters for the block acknowledgement protocol.

In some implementations, the method may include receiving a value indicating the FEC codeword buffer window size in an initialization message for a block acknowledgement protocol.

In some implementations, the method may include receiving a MAC layer block acknowledgement message from the second WLAN device, the MAC layer block acknowledgement message indicating that the second WLAN device did not receive the first MPDU. The method may include determining that the first MPDU corresponds to the first FEC codeword.

In some implementations, the method may include receiving a codeword block acknowledgement message from the second WLAN device, the codeword block acknowledgement message indicating that the second WLAN device did not decode the first FEC codeword.

In some implementations, the codeword block acknowledgement message includes a bitmap in which one bit uniquely identifies the first FEC codeword.

In some implementations, the method may include determining whether the second WLAN device has stored the first FEC codeword in a receiver buffer. The method may include determining to transmit the second set of parity bits based, at least in part, on a determination that the second WLAN device has stored the first FEC codeword in the receiver buffer.

In some implementations, the initial HARQ transmission is included in a first physical (PHY) layer protocol data unit (PPDU). The first PPDU may include a HARQ indicator in a header of the first PPDU to cause the second WLAN device to buffer one or more FEC codewords from the first PPDU in a receiver buffer when the second WLAN device is unable to decode the one or more FEC codewords from the first PPDU.

In some implementations, the method may include determining that the first WLAN device has not received a block acknowledgement message from the second WLAN device. The method may include transmitting a block acknowledgement request (BAR) message addressed to the second WLAN device. The BAR message may include one or more codeword identifier that indicate that the first WLAN device has transmitted the first FED codeword in the initial HARQ transmission.

In some implementations, the BAR message is transmitted using a robust encoding rate.

In some implementations, the method may include determining the first FEC codeword using a low-density parity check (LDPC) encoder that generates parity-check bits based on the first set of data bits and a first coding rate. The method may include determining the first set of parity bits by puncturing the parity-check bits generated by the LDPC encoder.

In some implementations, the method may include determining the second set of parity bits using the LDPC encoder that generates parity-check bits based on the first set of data bits and a second coding rate. The second coding rate may be different from the first coding rate.

In some implementations, the HARQ retransmission is encoded using a robust encoding scheme for reliable delivery to the second WLAN device.

In some implementations, the HARQ retransmission is included in a second MPDU. The second MPDU may include a type field that indicates the second MPDU includes the HARQ retransmission.

In some implementations, the type field is included in either a header or an information element of the second MPDU.

In some implementations, the second MPDU includes a sequence control field to indicate that the second set of parity bits corresponds to the first FEC codeword.

In some implementations, the HARQ retransmission is transmitted in a physical (PHY) layer protocol data unit (PPDU) from the first WLAN device to the second WLAN device. The PPDU may include a header that indicates the PPDU includes the HARQ retransmission.

In some implementations, the HARQ retransmission includes a sequence control field that identifies which FEC codewords are retransmitted in the second MPDU.

In some implementations, the HARQ retransmission includes more than one set of parity bits. Each set of parity bits may represent a different FEC codeword in the HARQ initial transmission that the second WLAN device was unable to decode.

In some implementations, the HARQ retransmission is included in a parity MPDU, and the parity MPDU is formed in an aggregate MPDU (AMPDU) transmission that includes multiple MPDUs that include at least the parity MPDU.

In some implementations, the AMPDU transmission includes the parity MPDU and an initial HARQ transmission of a second MPDU.

In some implementations, the AMPDU transmission includes different MPDUs for different sets of parity bits corresponding to different FEC codewords.

In some implementations, each MPDU includes a HARQ indicator to indicate whether or not the MPDU is a HARQ retransmission.

Another innovative aspect of the subject matter described in this disclosure can be implemented as a method performed by a second WLAN device. The method may include determining that a first WLAN device supports a HARQ retransmission protocol for managing retransmissions in a wireless local area network. The method may include receiving an initial HARQ transmission from the first WLAN device. The initial HARQ transmission may include at least a first forward error correction (FEC) codeword having a first set of data bits and a first set of parity bits. The method may include determining that the second WLAN device is unable to decode at least the first FEC codeword. The method may include storing the first FEC codeword in a receiver buffer of the second WLAN device. The method may include transmitting a feedback message to the first WLAN device to indicate that the second WLAN device is unable to decode at least the first FEC codeword. The method may include receiving a HARQ retransmission from the first WLAN device, the HARQ retransmission including at least a second set of parity bits corresponding to the first FEC codeword in response to the feedback message. The method may include decoding the first FEC codeword based, at least in part on the second set of parity bits.

In some implementations, the method may include transmitting a HARQ capability indicator to the first WLAN device to inform the first WLAN device that the second WLAN device supports the HARQ retransmission protocol.

In some implementations, the HARQ capability indicator is included in a block acknowledgement protocol, a MAC layer block acknowledgement message, a codeword block acknowledgement message, or a codeword-specific feedback message.

In some implementations, the method may include determining that the second WLAN device is unable to decode any FEC codewords in the first PPDU. The method may include storing the FEC codewords in the receiver buffer of the second WLAN device. The method may include transmitting a block acknowledgement message to the first WLAN device even though the second WLAN device is unable to decode any FEC codewords in the first PPDU. The block acknowledgement message may cause the first WLAN device to transmit additional parity bits for each of the FEC codewords.

In some implementations, the initial HARQ transmission is included in a first physical (PHY) layer protocol data unit (PPDU). The first PPDU may include a HARQ indicator in a header of the first PPDU to cause the second WLAN device to buffer one or more FEC codewords from the first PPDU in a receiver buffer when the second WLAN device is unable to decode the one or more FEC codewords from the first PPDU.

In some implementations, the HARQ retransmission is transmitted in a physical (PHY) layer protocol data unit (PPDU) from the first WLAN device to the second WLAN device. The PPDU may include a header that indicates the PPDU includes the HARQ retransmission.

In some implementations, the HARQ retransmission is included in a second MPDU. The second MPDU may include a type field that indicates the second MPDU includes the HARQ retransmission.

In some implementations, the HARQ retransmission includes more than one set of parity bits. Each set of parity bits may be for a different FEC codeword in the HARQ initial transmission that the second WLAN device was unable to decode.

In some implementations, the HARQ retransmission is included in a parity MPDU, and the parity MPDU is formed in an aggregate MPDU (AMPDU) transmission that includes multiple MPDUs that include at least the parity MPDU.

In some implementations, the AMPDU transmission includes the parity MPDU and an initial HARQ transmission of a second MPDU.

Another innovative aspect of the subject matter described in this disclosure can be implemented in a wireless communication device. In some implementations, the wireless communication device includes at least one modem, at least one at least one processor communicatively coupled with the at least one modem, and at least one memory communicatively coupled with the at least one processor and storing processor-readable code. The processor-readable code, when executed by the at least one processor in conjunction with the at least one modem, may be configured to perform any of the above methods.

Another innovative aspect of the subject matter described in this disclosure can be implemented in an apparatus. The apparatus may include a wireless communication device, at least one transceiver coupled to the at least one modem, at least one antenna coupled to the at least one transceiver to wirelessly transmit signals output from the at least one transceiver and to wirelessly receive signals for input into the at least one transceiver, and a housing that encompasses the at least one modem, the at least one processor, the at least one memory, the at least one transceiver and at least a portion of the at least one antenna. In some implementations, the wireless communication device includes at least one modem, at least one at least one processor communicatively coupled with the at least one modem, and at least one memory communicatively coupled with the at least one processor and storing processor-readable code. The processor-readable code, when executed by the at least one processor in conjunction with the at least one modem, may be configured to perform any of the above methods.

BRIEF DESCRIPTION OF THE DRAWINGS

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

Like reference numbers and designations in the various drawings indicate like elements.

DETAILED DESCRIPTION

Figure 1:
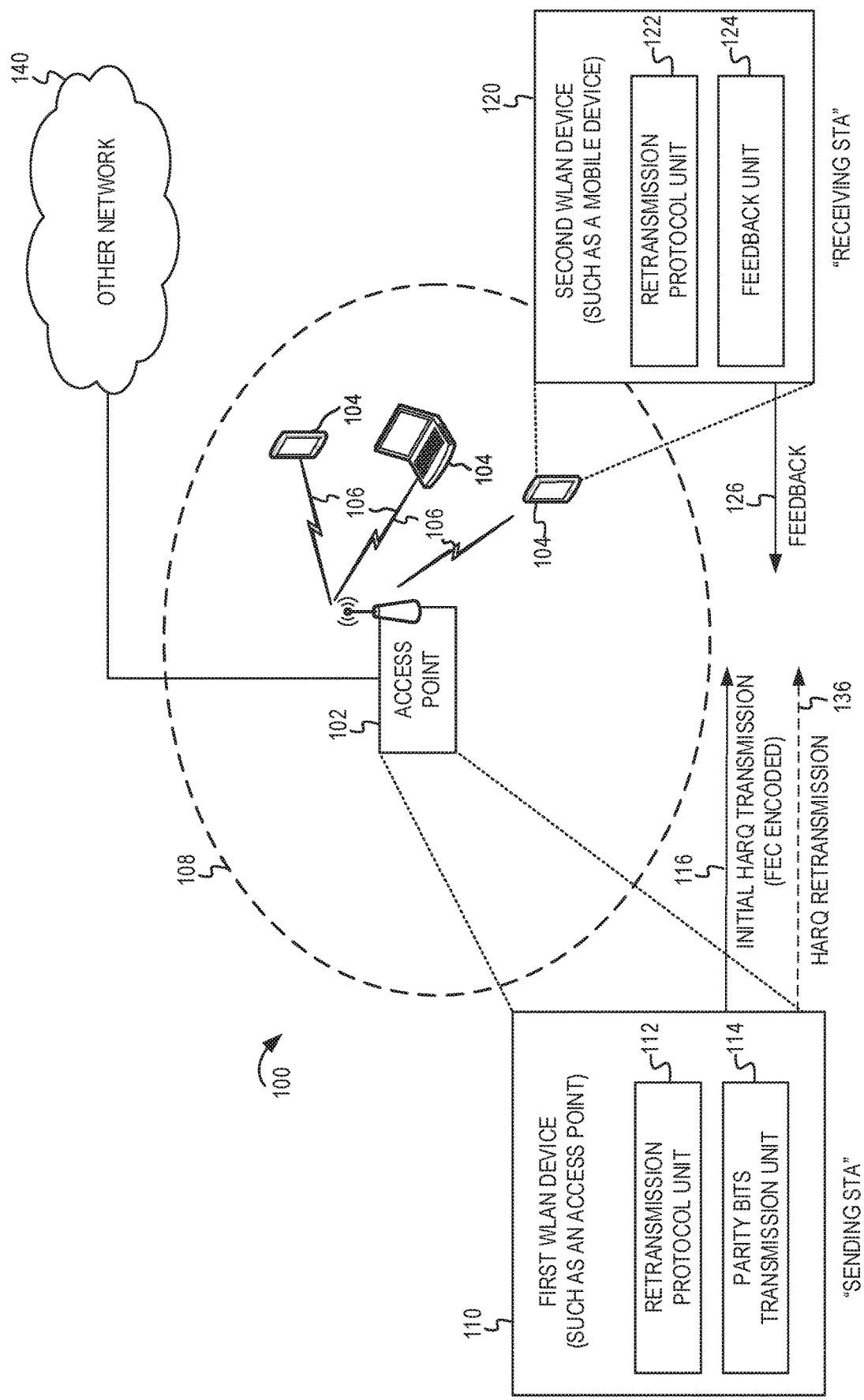
FIG. 1 depicts a system diagram of an example wireless local area network (WLAN) for introducing concepts of this disclosure.

The following description is directed to certain implementations for the purposes of describing the innovative aspects of this disclosure. However, a person having ordinary skill in the art will readily recognize that the teachings herein can be applied in a multitude of different ways. The examples in this disclosure are based on wireless local area network (WLAN) communication according to the Institute of Electrical and Electronics Engineers (IEEE) 802.11 wireless standards. However, the described implementations may be implemented in any device, system or network that is capable of transmitting and receiving RF signals according to one or more of the IEEE 802.11 standards, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IoT) network, such as a system utilizing 3G, 4G, 5G, 6G, or further implementations thereof, technology.

A wireless local area network (WLAN) in a home, apartment, business, or other area may include one or more WLAN devices. Each WLAN device may have a station (STA) interface which is an addressable entity that shares a wireless communication medium with other STAs. An AP is a type of STA that performs a distribution system access function in the WLAN. For brevity in this disclosure, WLAN devices may be referred to as STAs, regardless of whether the WLAN device is an AP or a non-AP STA. A first WLAN device (acting as a sending STA) may communicate data to a second WLAN device (acting as a receiving STA)

via a wireless channel. Due to the nature of wireless communication, the WLAN devices may implement a retransmission protocol to improve reliable delivery of a media access control (MAC) protocol data unit (MPDU). An MPDU also may be referred to as a packet in some aspects of this disclosure. A physical convergence layer (PHY) protocol data unit (PPDU) may include one or more MPDUs. For example, one type of PPDU (referred to as an Aggregated MPDU, or A-MPDU) may include multiple MPDUs in a payload of the AMPDU. A PPDU also may be referred to as a frame in some aspects of this disclosure.

A traditional retransmission protocol (which may be referred to as a baseline approach) may rely on retransmission of a full PPDU or MPDU. For example, a sending STA may await a feedback message that includes an acknowledgement (ACK). In some implementations, the absence of an ACK may be interpreted as a negative acknowledgement (NACK). A receiving STA may send a traditional ACK message to the sending STA to indicate whether the receiving STA has successfully received a PPDU. If the sending STA does not receive a traditional ACK message (by an expected time) in response to a PPDU, the sending STA may retransmit the original PPDU. In another retransmission protocol, the receiving STA may bundle ACKs or NACKs for multiple MPDUs in a block acknowledgement feedback message. The block acknowledgement feedback message may be referred to as a Block ACK message type. The Block ACK message type may indicate which MPDUs in an A-MPDU have been successfully received. A sending STA may retransmit those MPDUs which are not indicated as being received correctly in the Block ACK feedback message.

Hybrid automatic repeat request (hybrid ARQ or HARQ) is another retransmission protocol, sometimes used in wide area wireless communication systems. HARQ uses a combination of error detection and error correction. A HARQ transmission may include error checking bits that are added to data to be transmitted using an error-detecting (ED) code such as a cyclic redundancy check (CRC). The error checking bits may be used by a receiving STA to determine if it has properly decoded the received HARQ transmission. Additionally, the HARQ transmission may utilize an error correction technique. For example, the original data may be encoded with a forward error correction (FEC) encoding. Both the original data and parity bits may be sent in a HARQ transmission. A receiving STA may be able to use the parity bits to correct errors in the transmission, thus avoiding a full retransmission. The ED code may be omitted when encoding is used that can perform both FEC and ED, such as a Reed-Solomon code. Another feature of HARQ is that a receiving STA may combine a first HARQ transmission with a second HARQ transmission. For example, if the receiving STA cannot properly decode (and cannot correct the errors) the first HARQ transmission, the receiving STA may send a HARQ feedback message that indicates at least part of the first HARQ transmission was not properly decoded. In response to receiving the HARQ feedback message, the sending STA may transmit a second HARQ transmission to the receiving STA to communicate at least part of the first HARQ transmission that was not acknowledged. The receiving STA may combine the second HARQ transmission with the first HARQ transmission so that a total signal can be decoded. The combined HARQ transmissions may be processed for decoding and error correction.

In one aspect of this disclosure, a sending STA may store information regarding source data and FEC encoding used in an original transmission (such as a first PPDU). For brevity, many of the examples of this disclosure are based on low-density parity check (LDPC) encoding. However, other types of FEC encoding may be used. The FEC encoding produces a first set of parity bits that are communicated with the source data. The FEC encoded data may be communicated as FEC codewords in the original transmission. In accordance with the disclosed retransmission protocol, the sending STA may communicate additional parity bits associated with a particular FEC codeword of the original transmission. The sending STA may communicate the additional parity bits in a subsequent transmission to assist the receiving STA to recover the data from the original transmission. In some implementations, the original transmission may include an indication that additional FEC parity information is available. This disclosure describes several techniques for the sending STA to communicate the additional parity bits. For example, the additional parity bits may be included in a parity MPDU that is included in a subsequent transmission (such as a second PPDU). The parity MPDU (or the second PPDU) may include control information with the parity bits to assist the receiving STA in identifying the parity bits and associating them with the corresponding FEC codewords of the original transmission.

Several techniques are described for a receiving STA to indicate which portions of the original transmission were not properly received. For example, a Block ACK feedback message may identify MPDUs from the original transmission that were not properly decoded. The sending STA may determine which FEC codewords of the original transmission are associated with those failed MPDUs. In another example, a codeword-based Block ACK feedback message may be used to indicate which codewords from the original transmission were not properly decoded. In yet another example, a new type of feedback message may be used to request additional parity bites for a particular codeword.

In some implementations, a sending STA may determine whether to retransmit a PPDU, an MPDU, codeword, or parity bits based on the feedback from a receiving STA. For example, transmitting only the parity bits may be more efficient (than retransmitting a full PPDU, MPDU, or codeword) if the sending STA can determine that the receiving STA stored the previous codeword. A sending STA may communicate a feedback request to determine whether the receiving STA has stored the previous codeword. This disclosure includes a technique for determining that a receiving STA has stored all the codewords of a first PPDU even when the receiving STA was unable to decode any of the MPDUs in the first PPDU. For example, the sending STA may include a sequence control field and an identifier of the receiving STA in the first PPDU. The sending STA can send a feedback request using the sequence control field and identifier of the receiving STA to cause the receiving STA to respond with feedback indicating whether the receiving STA has stored the codewords of the first PPDU.

In some implementations, the additional parity bits may be communicated in a parity MPDU. The parity MPDU may include previously punctured bits associated with the previously-transmitted FEC codeword. Alternatively, or additionally, the parity MPDU may include new parity bits calculated based on the source data associated with the previously-transmitted FEC codeword. The new parity bits may be calculated using a different FEC encoding rate (such as a lower rate for more robust FEC encoding). The sending STA may include additional information in one or more headers of the parity MPDU to assist the receiving STA to combine the parity bits with the previously-transmitted FEC codeword. Examples of the additional information may include a type header, index value, sequence control field, position value (relative or absolute) to identify the codeword in the original transmission, or the like. In some implementations, the parity MPDU may include parity information for multiple codewords for one or more previous PPDUs. In some implementations, a retransmission protocol PPDU may be an AMPDU that includes more than one parity MPDU.

The sending STA may utilize a memory (such as a buffer) of the transmitter to store source data and FEC codewords until they have been acknowledged. Similarly, the receiving STA may utilize memory (such as a buffer) of the receiver to store previous FEC codewords for use with additional parity bits. In some implementations, the sending STA and the receiving STA may negotiate parameters to facilitate the retransmission protocol. For example, the sending STA and the receiving STA may exchange capability information or other parameters associated with the codeword-based parity retransmission protocol. In some implementations, the sending STA and the receiving STA may determine an FEC buffer window size. The FEC buffer window size may be determined by repurposing parameters associated with a higher layer retransmission protocol or based on a new parameter exchanged between the sending STA and the receiving STA.

Particular implementations of the subject matter described in this disclosure can be implemented to realize one or more of the following potential advantages. Implementing a retransmission protocol in a WLAN may improve the reliability of data communicated from a sending STA to a receiving STA. The use of a codeword-based parity retransmission protocol may reduce overhead associated with retransmission. For example, communicating additional parity bits in a parity MPDU may utilize less airtime than would otherwise be used to retransmit a full MPDU or previous PPDU. In some implementations, aspects of this disclosure enable a sending STA and receiving STA to determine which codewords have failed based on traditional feedback techniques. A sending STA may determine an appropriate retransmission technique based on the capability of the receiving STA and which previously sent FEC codewords have been stored by the receiving STA.

FIG. 1 depicts a system diagram of an example WLAN for introducing concepts of this disclosure. FIG. 1 includes a block diagram of an example wireless communication network 100. According to some aspects, the wireless communication network 100 can be an example of a WLAN such as a Wi-Fi network (and will hereinafter be referred to as WLAN 100). For example, the WLAN 100 can be a network implementing at least one of the IEEE 802.11 family of standards (such as that defined by the IEEE 802.11-2016 specification or amendments thereof). The WLAN 100 may include numerous wireless communication devices such as an AP 102 and multiple STAs 104 having wireless associations with the AP 102. The IEEE 802.11-2016 specification defines a STA as an addressable unit. An AP is an entity that contains at least one STA and provides access via a wireless medium (WM) for associated STAs to access a distribution service (such as another network 140). Thus, an AP includes a STA and a distribution system access function (DSAF). In the example of FIG. 1, the AP 102 may be connected to a gateway device (not shown) which provides connectivity to the other network 140. The DSAF of the AP 102 may provide access between the STAs 104 and another network 140. While AP 102 is described as an access point using an infrastructure mode, in some implementations, the AP 102 may be a traditional STA which is operating as an AP. For example, the AP 102 may be a STA capable of operating in a peer-to-peer mode or independent mode. In some other examples, the AP 102 may be a software AP (SoftAP) operating on a computer system.

Each of the STAs 104 also may be referred to as a mobile station (MS), a mobile device, a mobile handset, a wireless handset, an access terminal (AT), a user equipment (UE), a subscriber station (SS), or a subscriber unit, among other possibilities. The STAs 104 may represent various devices such as mobile phones, personal digital assistant (PDAs), other handheld devices, netbooks, notebook computers, tablet computers, laptops, display devices (for example, TVs, computer monitors, navigation systems, among others), wearable devices, music or other audio or stereo devices, remote control devices ("remotes"), printers, kitchen or other household appliances, key fobs (for example, for passive keyless entry and start (PKES) systems), among other possibilities.

The basic building block of a WLAN conforming to the IEEE 802.11 family of standards is a Basic Service Set (BSS), which is managed by an AP. A BSS refers to one STA (such as an AP) that has established service settings and one or more STAs that have successfully synchronized the service settings. Alternatively, a BSS may describe a set of STAs have synchronized matching mesh service profiles. Using the example architecture in FIG. 1, the AP 102 and the associated STAs 104 may be referred to as a first BSS managed by the AP 102. The BSS may be identified by a service set identifier (SSID) that is advertised by the AP 102. The AP 102 may periodically broadcast beacon frames ("beacons") to enable any STAs 104 within wireless range of the AP 102 to establish or maintain a respective communication link 106 (also referred to as a "Wi-Fi link" or "wireless association") with the AP. An "unassociated STA" (not shown) may not be considered part of the BSS because they do not have a wireless session established at the AP 102. The various STAs 104 in the WLAN may be able to communicate with external networks as well as with one another via the AP 102 and respective communication links 106. To establish a communication link 106 with an AP 102, each of the STAs is configured to perform passive or active scanning operations ("scans") on frequency channels in one or more frequency bands (for example, the 2.4 GHz, 5 GHz, 6 GHz or 60 GHz bands). To perform passive scanning, a STA listens for beacons, which are transmitted by respective APs 102 at a periodic time interval referred to as the target beacon transmission time (TBTT) (measured in time units (TUs) where one TU is equal to 1024 microseconds (s)). To perform active scanning, a STA 104 generates and sequentially transmits probe requests on each channel to be scanned and listens for probe responses from APs 102. Each STA 104 may be configured to identify or select an AP 102 with which to associate based on the scanning information obtained through the passive or active scans, and to perform authentication and association operations to establish a communication link with the selected AP.

FIG. 1 additionally shows an example coverage area 108 of the AP 102, which may represent a basic service area (BSA) of the WLAN 100. While one AP 102 is shown in FIG. 1, the WLAN 100 can include multiple APs 102. As a result of the increasing ubiquity of wireless networks, a STA 104 may have the opportunity to select one of many BSSs within range of the STA 104 or select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may be configured to periodically scan its surroundings to find a more suitable AP with which to associate. For example, a STA 104 that is moving relative to its associated AP 102 may perform a "roaming" scan to find another AP having more desirable network characteristics such as a greater received signal strength indicator (RSSI).

The APs 102 and STAs 104 may function and communicate (via the respective communication links 106) according to the IEEE 802.11 family of standards (such as that defined by the IEEE 802.11-2016 specification or amendments thereof including, but not limited to, 802.11aa, 802.11ah, 802.11aq, 802.11ay, 802.11ax, 802.11az, and 802.11ba). These standards define the WLAN radio and baseband protocols for the physical (PHY) and medium access control (MAC) layers. The APs 102 and STAs 104 transmit and receive frames (hereinafter also referred to as wireless communications") to and from one another in the form of physical layer convergence protocol (PLCP) protocol data units (PPDUs). Each PPDU is a composite frame that includes a PLCP preamble and header as well as one or more MAC protocol data units (MPDUs).

The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some implementations of the APs 102 and STAs 104 described herein also may communicate in other frequency bands, such as the 6 GHz band, which may support both licensed and unlicensed communications. The APs 102 and STAs 104 also can be configured to communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac, 802.11ax and 802.11be (also referred to as extreme high throughput, or EHT) standard amendments may be transmitted over the 2.4 and 5 GHz bands, each of which is divided into multiple 20 MHz channels. As such, these PPDUs are transmitted over a physical channel having a minimum bandwidth of 20 MHz. But larger channels can be formed through channel bonding. For example, PPDUs conforming to the IEEE 802.11n, 802.11ac, 802.11ax, and 802.11be standard amendments may be transmitted over physical channels having bandwidths of 40 MHz, 80 MHz or 160 MHz by bonding together two or more 20 MHz channels. For example, IEEE 802.11n described the use of 2 channels (for a combined 40 MHz bandwidth) and defined a High Throughput (HT) transmission format. IEEE 802.11ac described the use of 8 channels (for a combined 160 MHz bandwidth) and defined a Very High Throughput (VHT) transmission format. IEEE 802.11ax also supports a combined 160 MHz bandwidth (which is a combination of 8 channels of 20 MHz width each). For brevity, this disclosure includes descriptions of IEEE 802.11ax devices as an example. In IEEE 802.11ax, a transmission format may spread High Efficiency (HE) modulated symbols throughout a combined channel group. The techniques in this disclosure may be used with later versions of IEEE 802.11, including the EHT frame formats and protocols.

The AP 102 may be an example of a first WLAN device 110. Regardless of whether the first WLAN device 110 is an AP or a traditional STA, it may be referred to as a "sending STA" for the example retransmission protocols in this disclosure. The STAs 104 may be examples of the second WLAN device 120 and may be referred to as a "receiving STA" in the example retransmission protocols in this disclosure. To be clear, the designations of sending STA and receiving STA may be reversed in other example retransmission protocols. In the example retransmission protocols, the first WLAN device 110 may send an initial HARQ transmission 116 to the second WLAN device 120 and the second WLAN device 120 may respond with feedback 126. The initial HARQ transmission 116 may be FEC encoded and include FEC codewords. Each FEC codeword includes some data bits and a first set of parity bits. Based on the feedback 126, the first WLAN device 110 may transmit additional parity bits in a HARQ retransmission 136. The example original transmission, feedback, and subsequent transmission are further described in FIG. 3.

The first WLAN device 110 (as sending STA) may include a retransmission protocol unit 112 and a parity bits transmission unit 114. The retransmission protocol unit 112 may implement a retransmission protocol in accordance with aspects of this disclosure. The retransmission transmission unit 114 may prepare and communicate the initial HARQ transmission 116. The retransmission protocol unit 112 also may store information, such as the FEC codewords and source data, associated with the initial HARQ transmission 116. The parity bits transmission unit 114 may be configured to generate the additional parity bits for the HARQ retransmission 136 based on the previous source data or FEC codewords. The second WLAN device 120 (as receiving STA) may include a retransmission protocol unit 122 and a feedback unit 124. The retransmission protocol unit 122 may implement the retransmission protocol in accordance with aspects of this disclosure. The feedback unit 124 may prepare and communicate the feedback 126. In some instances, the first WLAN device 110 and the second WLAN device 120 may exchange service discovery frames or other management frames to ascertain whether both devices support the retransmission protocol or particular features of the retransmission protocol.

Figure 2:
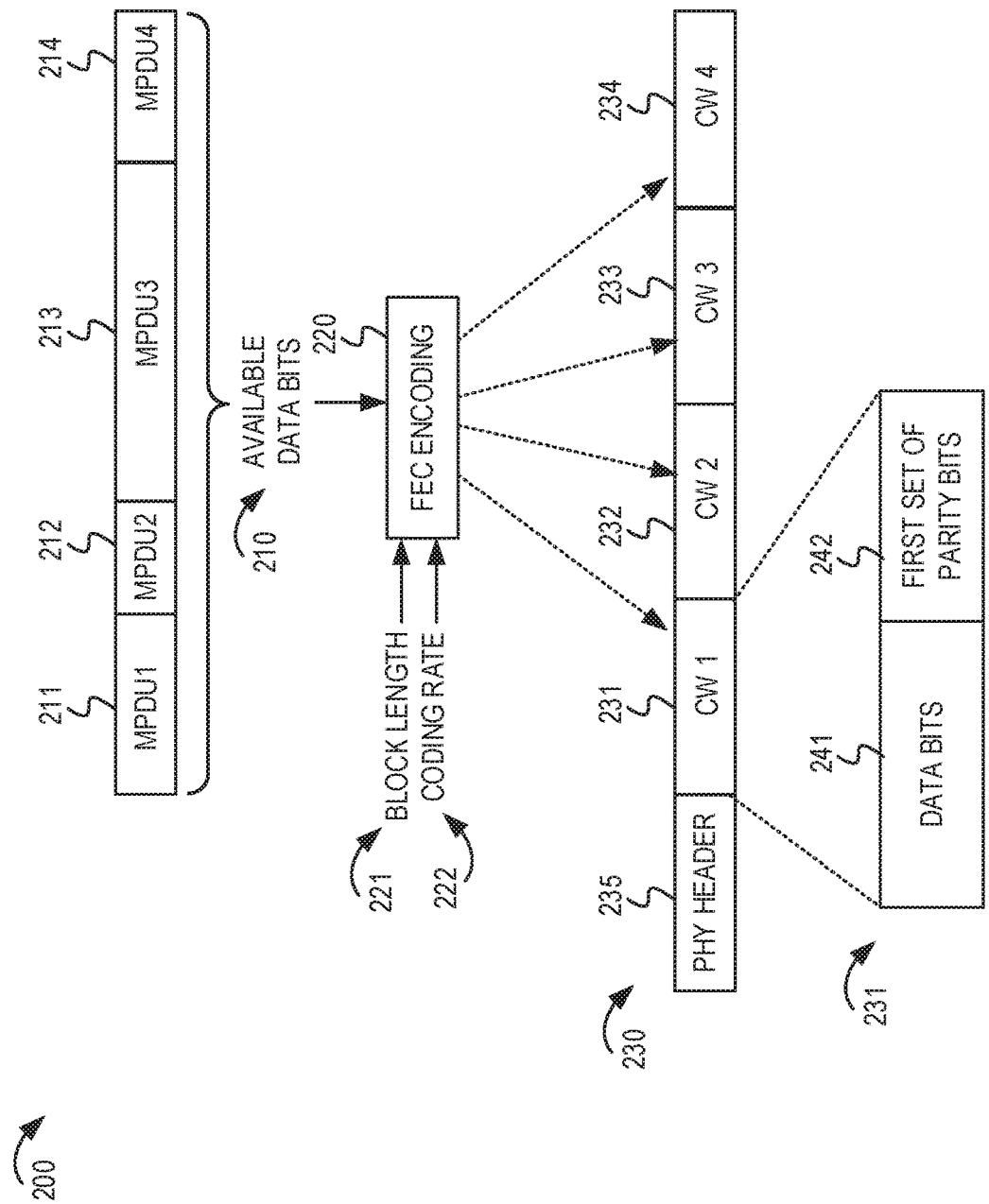
FIG. 2 depicts an example forward error correction (FEC) encoding process to distinguish between media access control (MAC) layer protocol data units (MPDUs) and a physical (PHY) protocol data unit (PPDU) with FEC codewords.

FIG. 2 depicts an example FEC encoding process to distinguish between MPDUs and a PPDU with FEC codewords. As an input to the FEC encoding process 200, a series of MPDUs 211, 212, 213, and 214 may be collectively referred to as source data having a series of available data bits 210 for FEC encoding. The FEC encoding process 220 may take blocks of the available data bits 210 based on a block length 221 parameter. Additionally, a coding rate 222 may affect how the FEC encoding process 220 processes the blocks of available data bits 210. For each block of available bits, the FEC encoding process 220 may determine a codeword. The FEC encoding process 220 can be used to populate a PPDU 230 with one or more codewords (such as codewords 231, 232, 233, and 234). A physical layer header 235 also may prepend the codewords. Each codeword 231 may include data bits 241 and a first set of parity bits 242. The quantity and length of the codewords (such as the codewords 231, 232, 233, and 244) in the PPDU 230 may be determined based on the number of available data bits 210 and the coding rate 222.

One example FEC encoding process may be based on LDPC encoding. There may be many alternative implementations of FEC encoding. LDPC is generally well known in the art. For example, IEEE 802.11-2016 includes a thorough explanation of LDPC encoding. The LDPC encoding may be systematic, such that it encodes an information block, c=(i0, i1, ... , i(k−1)), of size k, into a codeword, c, of size n, c=(i0,i1, ... i(k−1), p0, p1, ... , p(n−k−1)), by adding n−k parity bits. The parity bits are calculated using LDPC parity-check matrices. Example coding rates, information block lengths, and codeword block lengths are described in Table 1.

TABLE 1

| Coding Rate (R) | LDPC information block length (available bits) | LDPC codeword block length (codeword bits) |
|---|---|---|
| 1/2 | 972 | 1944 |
| 1/2 | 648 | 1296 |
| 1/2 | 324 | 648 |
| 2/3 | 1296 | 1944 |
| 2/3 | 864 | 1296 |
| 2/3 | 432 | 648 |
| 3/4 | 1458 | 1944 |
| 3/4 | 972 | 1296 |
| 3/4 | 486 | 648 |
| 5/6 | 1620 | 1944 |
| 5/6 | 1080 | 1296 |
| 5/6 | 540 | 648 |

The quantity and length of the LDPC codewords (such as the codewords 231, 232, 233, and 244 in the PPDU 230) may be determined based on the number of available data bits 210 and the coding rate 222. Example parameters are described in Table 2.

TABLE 2

| Range of $N_{avbits}$ (bits) | Number of LDPC codewords in PPDU | LDPC codeword length (each codeword) |
|---|---|---|
| $N_{avbits} \leq 648$ | 1 | 1296, if $N_{avbits} \geq N_{pld} + 912 \times (1 - R)$ 648, otherwise |
| $648 < N_{avbits} \leq 1296$ | 1 | 1944, if $N_{avbits} \geq N_{pld} + 1464 \times (1 - R)$ 1296, otherwise |
| $1296 < N_{avbits} \leq 1944$ | 1 | 1944 |
| $1944 < N_{avbits} \leq 2592$ | 2 | 1944, if $N_{avbits} \geq N_{pld} + 2916 \times (1 - R)$ 1296, otherwise |
| $2592 < N_{avbits}$ | $\left\lceil \dfrac{N_{pld}}{1944 \times R} \right\rceil$ | 1944 |

The available data bits may be padded to fill a number of bits in a payload of a PPDU ($N_{pld}$ may be the number of bits in a PSDU and SERVICE field to include in the PPDU). After adding padding (also referred to as shortening bits), the distributed (segmented) into codeword blocks for LDPC encoding and puncturing. For example, parity bits may be added to the data bits and padding. The shortening bits may be discarded after the LDPC encoding. Furthermore, the parity bits may be punctured. Typically, puncturing involves discarding some of the parity bits to reduce the size of the codeword. After puncturing, in some implementations, a first portion of the codeword may be repeated in a last portion of the codeword.

In accordance with this disclosure, a sending STA may store the punctured bits. For example, a parity MPDU may include the punctured bits that were removed from the first set of parity bits. In another implementation, the sending STA may use a different coding rate (to generate different parity bits) based on the same source data associated with an FEC codeword. Because the size of the FEC codewords and coding rates are specified (such as Table 1 and Table 2), the sending STA and the receiving STA may use corresponding processes for encoding and decoding, respectively.

It should be apparent that the collection of MPDUs (such as MPDUs 211, 212, 213, and 214) may be distributed to different codewords (codewords 231, 232, 233, and 234). The boundaries between MPDUs and codewords may not be aligned. A single codeword may include data from multiple MPDUs. Furthermore, a single MPDU may span multiple codewords. In one aspect of this disclosure, a sending STA may maintain a mapping of which MPDUs have been encoded in which codewords. For example, if a receiving STA indicates that MPDUs 211 and 212 were not properly received while MPDUs 213 and 214 were properly received, the sending STA may determine that the receiving STA was unable to decode the first codeword 231. The sending STA may transmit additional parity bits for the first codeword 231 in a subsequent transmission. Furthermore, the subsequent transmission may not include a retransmission of data, but rather may include just the additional parity bits. The receiving STA may combine the additional parity bits with the first set of parity bits 242 in the first codeword 231 to decode the first 231.

Figure 3:
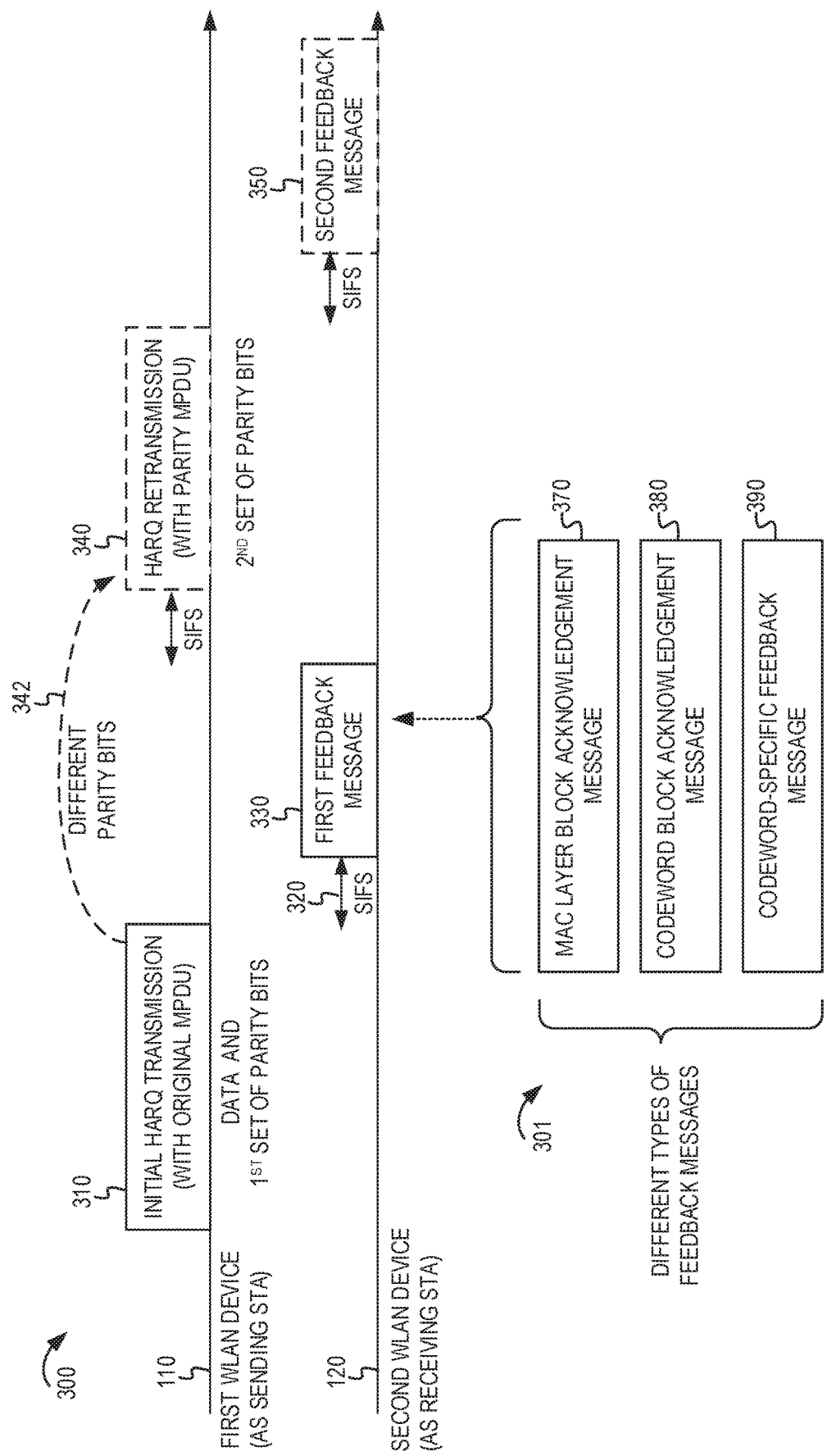
FIG. 3 depicts an example retransmission protocol using a parity MPDU.

FIG. 3 depicts an example retransmission protocol using a parity MPDU. A retransmission process 300 may begin with transmission of an initial HARQ transmission 310 from the first WLAN device 110 to the second WLAN device 120. In some implementations, the initial HARQ transmission 310 may be formatted to indicate that the first WLAN device 110 supports the retransmission protocol. For example, the initial HARQ transmission 310 may be formatted as a PPDU that includes a header, field, or indicator that signals that additional parity bits are available to send if the second WLAN device 120 is unable to decode the FEC encoded codewords in the initial HARQ transmission 310. Upon seeing the header, field, or indicator, the second WLAN device 120 may be configured to store one or more of the codewords of the initial HARQ transmission 310 for a subsequent decoding attempt after receiving the additional parity bits. In some implementations, the initial HARQ transmission 310 may be formatted using a PPDU as described in FIG. 5.

In response to the initial HARQ transmission 310, the second WLAN device 120 may send a first feedback message 330 back to the first WLAN device 110. The first feedback message 330 may begin after an interframe space 320 (such as a short interframe space (SIFS), a reduced interframe space (RIFS), a PCF interframe space (PIFS)) or the like. Alternatively, the interframe space 320 may be a backoff period before a contention-based access by the second WLAN device 120. In some implementations, the interframe space 320 may represent a determinable time period to maintain synchronization in the WLAN. The first feedback message 330 may be one of a variety of different types of feedback messages 301. For example, the first feedback message 330 may be MAC layer block acknowledgement message 370, a codeword block acknowledgement message 380, or a codeword-specific feedback message 390.

An example of the MAC layer block acknowledgement message 370 may include a block acknowledgement (Block Ack) message that indicates which MPDUs in the initial HARQ transmission 310 were successfully received. If the first WLAN device 110 receives the MAC layer block acknowledgement message 370, the first WLAN device 110 may determine which codewords in the initial HARQ transmission 310 were not successfully decoded resulting in the failed MPDUs. An example of the codeword block acknowledgement message 380 may include a message with a bitmap or other format that indicates which codewords of the initial HARQ transmission 310 were properly decoded. An example of the codeword-specific feedback message 390 may include a new type of acknowledgement message that identifies a specific codeword of the initial HARQ transmission 310 and either an acknowledgement (ACK) or negative acknowledgement (NACK). Regardless of the type of feedback message, the first WLAN device 110 may determine which codewords in the initial HARQ transmission 310 were not successfully received or decoded based on the first feedback message 330. In the example of FIG. 3, the first feedback message 330 may suggest to the first WLAN device 110 that a first FEC codeword of the initial HARQ transmission 310 was not successfully decoded by the first WLAN device 110.

In response to a determination that the first FEC codeword was not successfully decoded, the first WLAN device 110 may determine different parity bits 342 associated with the first FEC codeword and communicate the different parity bits 342 in a HARQ retransmission 340. The HARQ retransmission 340 may be referred to as a parity retransmission even though the parity bits in the HARQ retransmission 340 are different from the initial HARQ transmission 310. Thus, the HARQ retransmission 340 includes a second set of parity bits, different from the first set of parity bits that were included in first FEC codeword. As described in FIG. 2, in some implementations, the different parity bits 342 may be based on punctured bits that were removed from the parity bits calculated during FEC encoding of the first FEC codeword. Alternatively, the different parity bits 342 may be computed using a new FEC process on the same set of source data associated with the first FEC codeword. The HARQ retransmission 340 (including the parity MPDU) may include the different parity bits without having the full codeword or any source data associated with the first FEC codeword.

Following the HARQ retransmission 340, the second WLAN device 120 may attempt to decode the first FEC codeword using the different parity bits 342. In some implementations, the first WLAN device 110 may combine the first set of parity bits and the second set of parity bits into a combined set of parity bits for an FEC decoding process. The second WLAN device 120 may send a second feedback message 350 (similar to the first feedback message 330) to indicate whether the first FEC codeword was successfully decoded. As described with the first feedback message 330, the second feedback message 350 may be based on a MAC layer block acknowledgement message for the MPDUs in the initial HARQ transmission 310.

Figure 4:
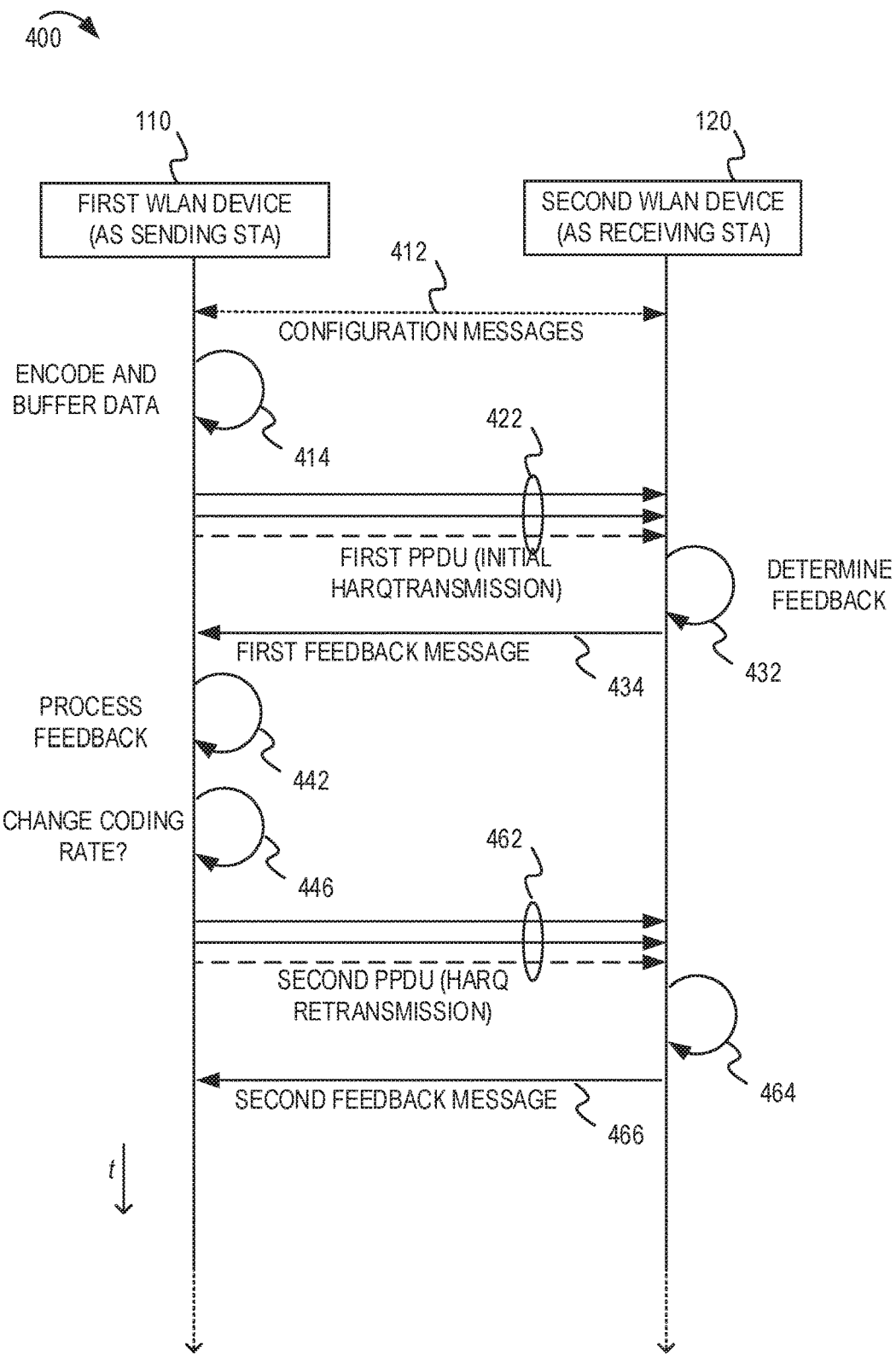
FIG. 4 depicts an example message flow diagram associated with an example retransmission protocol.

FIG. 4 depicts an example message flow diagram associated with an example retransmission protocol. The example message flow 400 shows the first WLAN device 110 (as the sending STA) and the second WLAN device 120 (as the receiving STA). The first WLAN device 110 and the second WLAN device 120 may exchange configuration messages 412 (such as the example of FIG. 9) to setup the retransmission protocol. In some implementations, the configuration may be set ahead of time and reused for communications. As an example, the configuration messages 412 may include messages to setup a MAC layer block acknowledgement protocol (such as ADD Block Ack (ADDBA) request and response messages).

At process 414, the first WLAN device 110 may encode and buffer a first set of data. A first PPDU 422 (which may include the initial HARQ transmission) may include multiple MPDUs or segments of the first set of data. At process 432, the second WLAN device 120 may attempt to decode the first PPDU 422 and may prepare a first feedback message 434 to send back to the first WLAN device 110. At process 442, the first WLAN device 110 may process the first feedback message 434 and determine to send additional parity bits for at least one codeword of the first PPDU 422.

In some implementations, the first feedback message 434 may include parameters to modify a parameter used by the first WLAN device 110 to calculate for the additional parity bits. For example, the first feedback message 434 may indicate a different coding rate to use for calculating the additional parity bits. Alternatively, the first WLAN device 110 may determine to use a new coding rate for calculating the additional parity bits. At process 446, the first WLAN device 110 may prepare the additional parity bits for a HARQ retransmission in a second PPDU 462. In some implementations, the second PPDU 462 may have parity bits for more than one unsuccessfully decoded codewords indicated by the first feedback message 434. For example, the second PPDU 462 may have a parity MPDU that is formatted with parity bits for multiple codewords. In another example, the second PPDU 462 may be an AMPDU that has multiple parity MPDUs, such that each parity MPDU is associated with a different codeword. The second PPDU 462 may be referred to by different names, including a subsequent transmission (in relation to the original transmission), a parity transmission packet, a parity retransmission, an incremental FEC parity transmission, or the like. In one aspect, the second PPDU 462 may differ from some traditional incremental redundancy retransmission protocols in that the second PPDU 462 may not include any source data associated with the original data in the first PPDU 422. In another aspect, the second PPDU 462 differs from traditional retransmission protocols in that the second PPDU 462 is based on FEC codewords (at the physical layer) rather than PDUs associated with a higher protocol layer.

Following the second PPDU 462, the second WLAN device 120 may combine the second set of parity bits from the second PPDU 462 with the first set of parity bits in the 422 to decode (shown at process 464) the first FEC codeword. The second WLAN device 120 may send a second feedback message 466 to indicate whether the first FEC codeword was successfully decoded.

Figure 5:
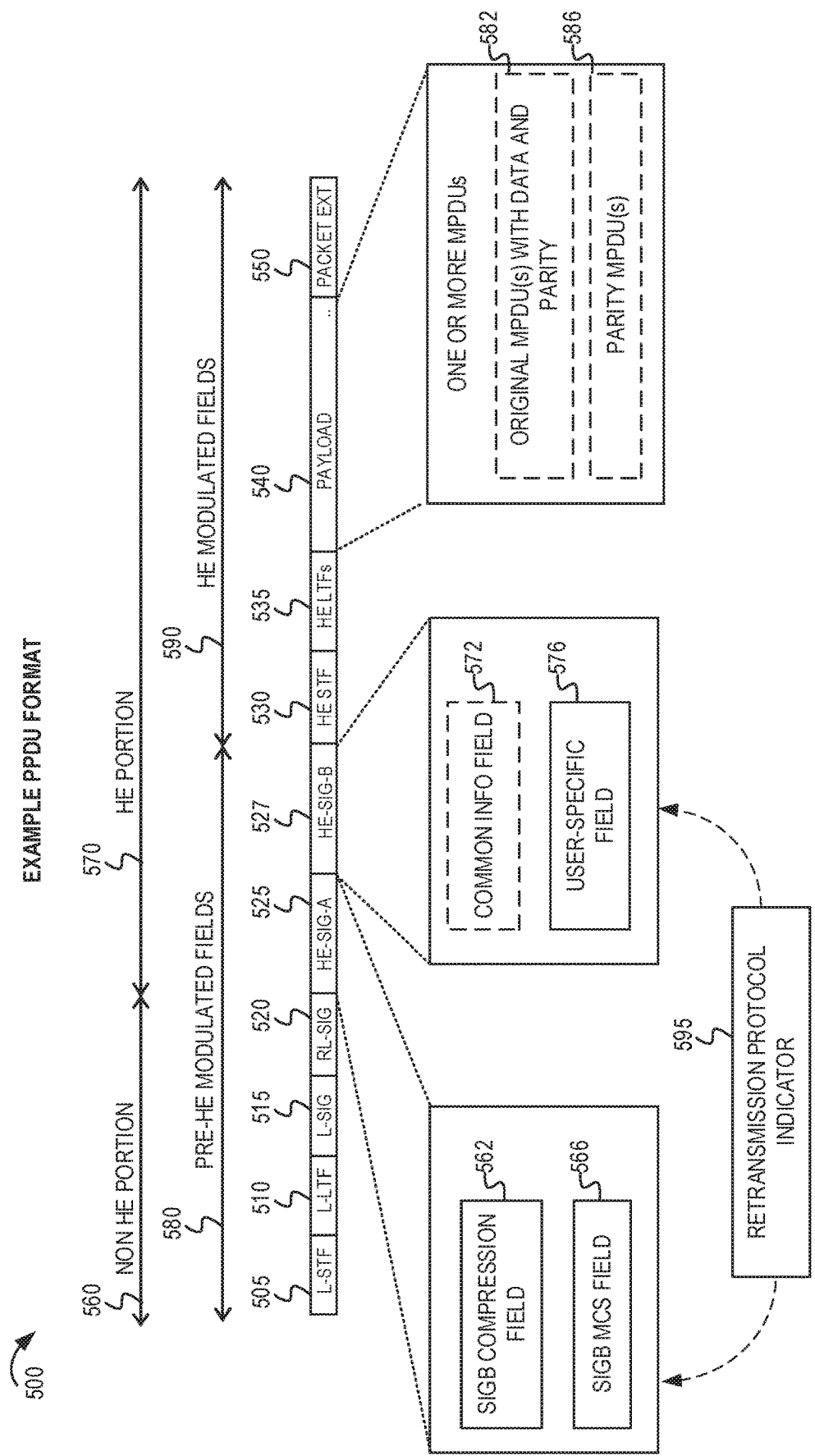
FIG. 5 depicts an example PPDU format for use with aspects of this disclosure.

FIG. 5 depicts an example PPDU format for use with aspects of this disclosure. In some implementations, the example PPDU format 500 may be based on a high-efficiency (HE) multi-user (MU) PPDU format defined in IEEE 802.11ax draft standard. Although the HE MU PPDU format is typically used to aggregate communications to multiple STAs, in some implementations the HE MU PPDU may be used to communicate with a single STA. In some implementations, the PPDU format 500 may repurpose some fields of the HE MU PPDU format. The PPDU format 500 may be modified to support the aspects of this disclosure. In some implementations, the PPDU format 500 may be modified for use as a transmission to a single receiving STA identified in a header of the PPDU format 500. In some implementations, the PPDU format 500 may be modified, extended, or redefined to support a retransmission protocol such as those described in this disclosure. For example, a PPDU that includes additional parity bits may include an indication to specify it is a parity retransmission associated with a previous original transmission. For example, predetermined values may be defined for some fields of the HE MU PPDU format to cause a receiving STA to identify a MU-PPDU as a retransmission protocol PPDU.

In addition to identifying the PPDU as a retransmission protocol PPDU, it may be desirable for a receiving STA to determine whether the retransmission protocol PPDU is intended for it. For example, a header of the retransmission protocol PPDU may include a first identifier associated with the sending STA and a second identifier associated with the receiving STA. Although identifiers of the sending STA and receiving STA may be included in a header of an MPDU encapsulated by the parity MPDU, in some implementations, the sending STA may use an unencoded portion of the PPDU header to identify the receiving STA or the sending STA.

Turning to the example PPDU format 500, each field and portion will be briefly described. A non-HE portion 560 includes a legacy short training field 505 (L-STF), a legacy long training field 510 (L-LTF), and a legacy signal field 515 (L-SIG). The remaining portion of the PPDU is considered an HE modulated portion 570 because it includes features that are relevant to devices capable of HE transmissions. The pre-HE modulated fields 580 include the non-HE portion 560 as well as some fields to bootstrap the HE modulated fields 590. For example, the pre-HE modulated fields 580 may further include a repeated legacy signal field 520 (RL-SIG), a first HE signal field 525 (HE-SIG-A), and a second HE signal field 527 (HE-SIG-B). The repeated legacy signal field 520 and the first HE signal field 525 may be modulated using a more reliable (robust) modulation than has lower throughput than the modulation scheme using for the HE modulated fields 590.

The HE modulated fields 590 includes an HE short training field 530 (HE STF), one or more symbols for an HE long training field 535 (HE LTF), a payload 540, and may include a packet extension field 550. The HE modulated fields 590 is modulated using inverse fast Fourier transform (IFFT) to convert the signal to orthogonal carrier transmissions in the time domain. The payload 540 may include FEC-encoded codewords based on one or more MPDUs.

The HE-SIG-A may include fields such as a SIGB Compression field 562 and a SIGB MCS field 566. There may be other fields (not shown) in the HE-SIG-A. For example, a Number of Users field (not shown) may indicate only 1 user if the HARQ PPDU is being used for a single user. A value of "1" in the SIGB Compression field 562 may be used to indicate a short format for the HE-SIG-B field, such as when the HARQ PPDU is being sent to a single user. When the SIGB Compression field 562 indicates "1," a common information field 572 may be eliminated from the HE-SIG-B field to reduce overhead. The HE-SIG-B field may include one or more user-specific fields 576. In the example where the HARQ PPDU is being sent to a single user, there will be only one user-specific field 576.

To help the receiving STA identify the PPDU as a retransmission protocol PPDU, the PPDU format 500 may include a retransmission protocol indicator 595 (which also may be referred to as a HARQ protocol indicator). The retransmission protocol indicator 595 may be included in the HE-SIG-A or the HE-SIG-B, or both. Furthermore, there may be different ways to include a retransmission protocol indicator. In some implementations, the retransmission protocol indicator 595 may be represented by a combination of predetermined values in the fields of a HE MU PPDU format. Another alternative for the retransmission protocol indicator 595 may use a reserved bit in the user-specific field 576. There may be other ways to represent the retransmission protocol indicator 595 in the PPDU.

The payload 540 may include one or more MPDUs. For example, if the PPDU is for an original transmission, the one or more MPDUs 582 may be original MPDUs with original data and a first set of parity bits. If the PPDU is used for a parity retransmission, the one or more MPDUs 586 may be parity MPDUs that include a second set of parity bits associated the original data. In some implementations, the payload 540 may include a mix of original MPDUs (with original data and a first set of parity bits) as well as parity MPDUs (for a codeword in a previous PPDU).

Figure 6:
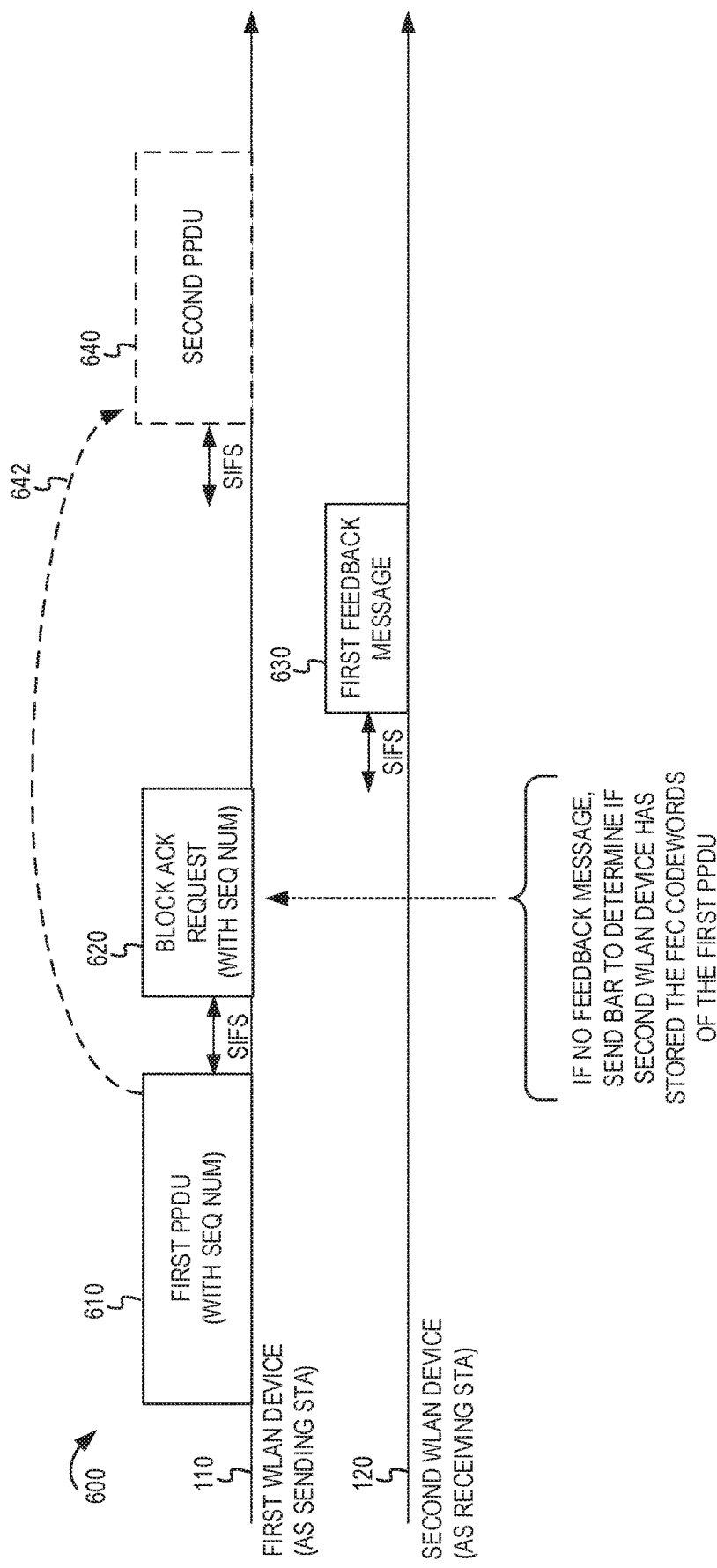
FIG. 6 depicts an example retransmission protocol that supports parity retransmission.

FIG. 6 depicts an example retransmission protocol that supports parity retransmission. The example in FIG. 6 may be useful in a scenario where the second WLAN device 120 does not successfully decode any of the MPDUs in an original transmission. For example, the second WLAN device 120 may not identify the MPDUs as being intended for the second WLAN device 120. Typically, the second WLAN device 120 would not send a feedback message unless it has successfully decoded at least one MPDU. However, the technique in FIG. 6 may support a parity retransmission even when the second WLAN device 120 has not successfully decoded or acknowledged any of the MPDUs in a previous transmission.

The example retransmission process 600 may begin with transmission of a first PPDU 610 from the first WLAN device 110 to the second WLAN device 120. The first PPDU 610 may be formatted to indicate that it supports the retransmission protocol. In this example, the first PPDU 610 may include a sequence number associated with the MPDUs in the first PPDU 610. If the first WLAN device 110 does not receive a feedback message from the second WLAN device 120 (or after a predetermined time limit), the first WLAN device 110 may send feedback request message (such as a block acknowledgement request (BAR) message 620). The BAR message 620 may include the sequence number that was in the first PPDU 610. Although this technique is described in terms of a sequence number, other types of values may be used to identify an MPDU in the first PPDU 610. In some implementations, the BAR message 620 may be sent using a robust modulation and coding scheme (MCS) to increase the likelihood that the second WLAN device 120 will receive it.

The second WLAN device 120 can determine from the BAR message 620 that the first PPDU 610 included some MPDUs intended for the second WLAN device 120. The second WLAN device 120 may have the first PPDU 610 stored in a buffer or other memory of its receiver. By storing the first PPDU 610, the second WLAN device 120 can take advantage of the parity retransmission concepts in this disclosure. The second WLAN device 120 may send a first feedback message 630 back to the first WLAN device 110. In some implementations, the first feedback message 630 may be used by the first WLAN device 110 to determine whether the second WLAN device 120 has stored the original FEC codewords. If so, the first WLAN device 110 may send a second PPDU 640 having a parity retransmission (additional parity bits 642 without the overhead of the original codewords). However, if the first WLAN device 110 determines from the first feedback message 630 that the second WLAN device 120 did not store the original FEC codewords, the first WLAN device 110 may send the second PPDU 640 having the original source MPDUs. Absent the BAR message 620 and the first feedback message 630, the first WLAN device 110 may be unable to determine whether the second WLAN device 120 has stored the original FEC codewords from the first PPDU 610 unless the second WLAN device 120 successfully decoded at least one MPDU from the first PPDU 610.

There may be other ways for the first WLAN device 110 to determine whether the second WLAN device 120 has stored the original codewords for the first PPDU 610. For example, if the first PPDU 610 includes an identifier of the second WLAN device 120 in a robust header, the second WLAN device 120 may determine that the first PPDU 610 has MPDUs intended for it even if the first PPDU 610 does not successfully decode the codewords. The second WLAN device 120 may store the codewords and request a parity retransmission from the first WLAN device 110 using a new type of feedback message associated with requesting additional parity bits for a previous codeword.

Figure 7:
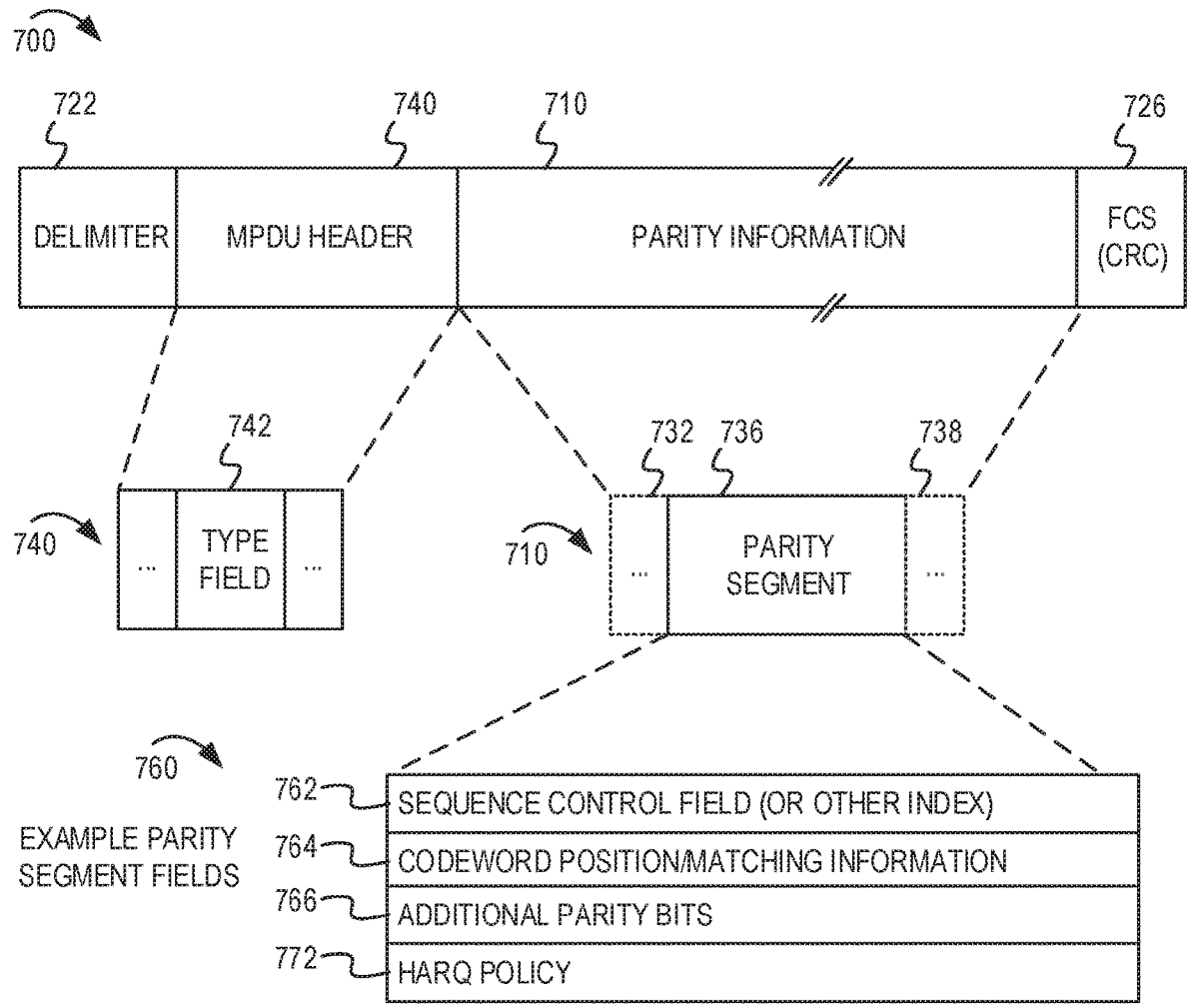
FIG. 7 depicts an example parity MPDU format for use with aspects of this disclosure.

FIG. 7 depicts an example parity MPDU format for use with aspects of this disclosure. For example, the example parity MPDU 700 may be sent from a first WLAN device (as sending STA) to a second WLAN device (as receiving STA) to provide additional parity bits for a codeword in a previous transmission. The parity MPDU 700 may include a delimiter 722, an MPDU header 740, a parity information 710. In some implementations, the parity MPDU itself may be FEC encoded and a frame check sequence (FCS) 726 may be included. The delimiter 722 may include one or more bits to establish synchronization. The delimiter 722 may be used, for example, to indicate where the parity MPDU begins within a PPDU that has multiple parity MPDUs. In some implementations, the MPDU header 740 may include source and destination network addresses (such as the network address of the sending STA and receiving STA, respectively). In some implementations, the MPDU header 740 also may include a type field 742. The type field 742 may be used to indicate the MPDU is a parity MPDU for communicating additional parity bits associated with a codeword of a previous transmission. For example, the value of the type field 742 may be a new type, subtype, or extended type value in a technical specification. Alternatively, a reserved bit in the MPDU header 740 may be used to indicate that it is a parity MPDU. In another example, an information element (not shown) in the parity MPDU may indicate the type.

The parity information 710 may be used to convey the additional parity bits. In some implementations, the parity information 710 may include one or more parity segments 732, 736, and 738. Each parity segment may include the additional parity bits 766 for a different codeword. Other information may be included with each parity segment. For example, example parity segment fields 760 may include information to help the receiving STA determine to which codeword the additional parity bits 766 are associated. In FIG. 7, the example parity segment fields 760 may include a sequence control field 762 or other field (including an index or other value). Another example may be codeword position/matching information 764.

For example, an index for the parity segment may relate to a corresponding codeword of the previous transmission. A sequence Control field in the MPDU header 740 may include the sequence number of the first incorrect MPDU that was either the first MPDU or the first MPDU after a failed MPDU in the previous transmission. Alternatively, the sequence control field 762 may include an index corresponding to the position of the failed codeword in the previous transmission. If the codeword position/matching information 764 is included, it may indicate a bit or byte position of the start of the codeword to which the parity segment is related. Other fields could be included in the parity MPDU. For example, if the additional parity bits 766 were calculated using a different FEC coding rate, there may be a field in the MPDU header 740 or the parity information 710 that indicates the coding rate used to determine the additional parity bits 766.

In some implementations, a WLAN device may send a HARQ policy 772. For example, the HARQ policy may indicate capabilities or configurations regarding the HARQ protocol supported by the WLAN device.

Figure 8A:
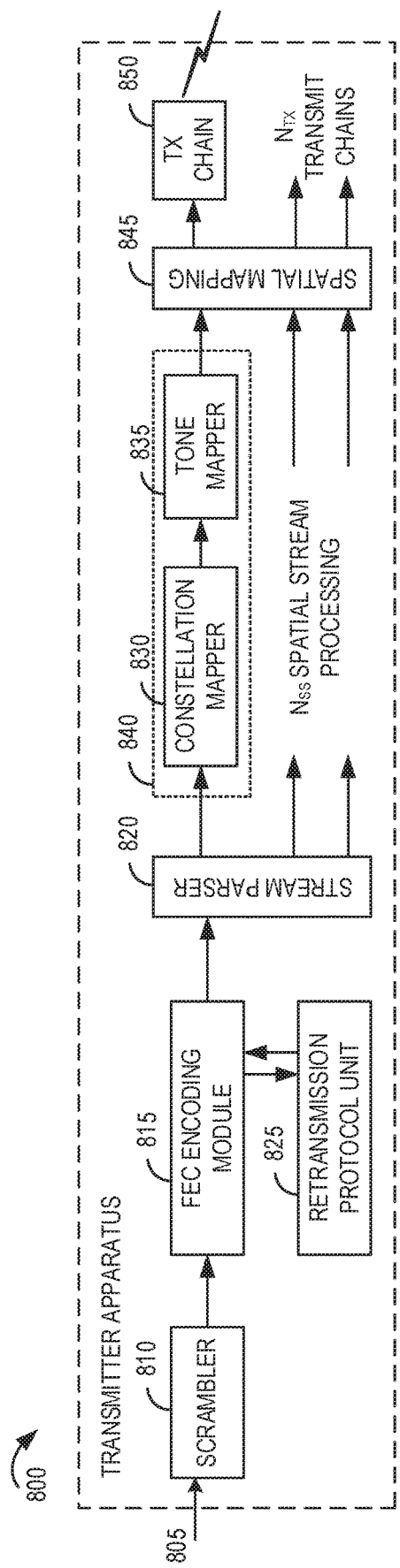
FIG. 8A depicts a block diagram of an example transmitter apparatus for a sending STA that supports an example retransmission protocol.

FIG. 8A depicts a block diagram of an example transmitter apparatus for a sending STA that supports an example retransmission protocol. The example transmitter apparatus 800 shows some of the functional blocks in a sending STA. The example transmitter apparatus 800 is one of many designs for a transmitter. In this figure, the example transmitter apparatus 800 is designed for LDPC encoding. In the design described in FIG. 8A, source data 805 may be processed by a scrambler 810 and an FEC encoding module 815. The scrambler 810 may scramble the source data 805 to reduce the probability of long sequences of zeros or ones. The FEC encoding module 815 may perform encoding for error correction and error detection. For example, the FEC encoding module 815 may perform FEC and add redundancy or CRC bits to the source data. A retransmission protocol unit 825 may maintain a mapping between the scrambled source data and the output of the FEC encoding module 815. Furthermore, the retransmission protocol unit 825 may store the codeword, punctured parity bits, or other information generated by the FEC encoding module 815. The encoded data may be sent to a stream parser 820 that divides the encoded data into Nss spatial streams. In some implementations, there may only be one spatial stream and the stream parser 820 may be unused. An example of spatial stream processing 840 may include a constellation mapper 830 and a tone mapper 835. The constellation mapper 830 maps the sequence of bits in each spatial stream to constellation points (complex numbers). The constellation mapper 830 may perform the modulation of the bits based on an MCS that defines the constellation points. The tone mapper 835 may translate the output from the constellation mapper 830 to the frequencies used for the transmission.

After the spatial streams are processed, a spatial mapping 845 may map space-time streams to $N_{TX}$ transmit chains (including TX chain 850). There may be different ways of mapping the streams to transmit chains. For example, in a direct mapping the constellation points from each space-time stream may be mapped directly onto the transmit chains (one-to-one mapping). Another example may use spatial expansion, in which vectors of constellation points from all the space-time streams are expanded via matrix multiplication to produce the input to all of the transmit chains. The spatial mapping 845 may support beamforming (like spatial expansion), in which each vector of constellation points from all of the space-time streams is multiplied by a matrix of steering vectors to produce the input to the transmit chains.

Each TX chain 850 may prepare a plurality of OFDM symbols based on the constellation points. For example, the TX chain 850 may include an inverse discrete Fourier transform (IDFT) that converts a block of constellation points to a time domain block. The TX chain 850 may include a cyclic shift (CSD), guard interval inserter, and an analog front end to transmit OFDM symbols as radio frequency (RF) energy.

The transmitter apparatus 800 described in FIG. 8A is only one example of a transmitter apparatus. Other block diagrams may add or remove functional blocks.

Figure 8B:
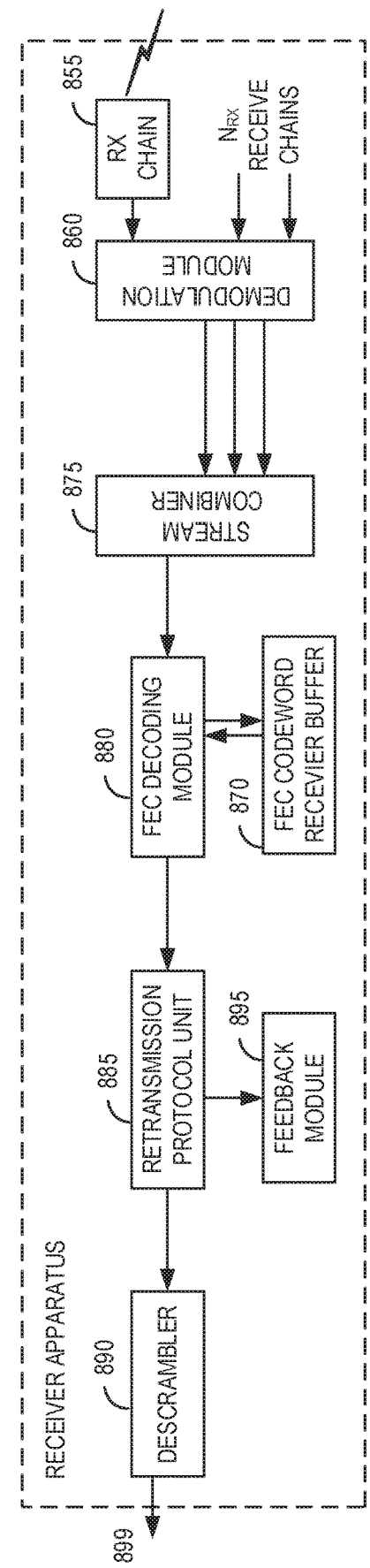
FIG. 8B depicts a block diagram of an example receiver apparatus for a receiving STA that supports an example retransmission protocol.

FIG. 8B depicts a block diagram of an example receiver apparatus for a receiving STA that supports an example retransmission protocol. The example receiver apparatus 801 shows some of the functional blocks in a receiving STA. The example receiver apparatus 801 is one of many possible designs for a receiver. In the example of FIG. 8B, RF energy may be received by an analog front end of a receive (RX) chain 855. For example, the RX chain 855 may include an antenna and automatic gain control (AGC) components (not shown). Furthermore, the RX chain 855 may include a fast Fourier transform (FFT) function to convert time domain symbols to a frequency domain representation of received data. $N_{RX}$ receive chains may prepare frequency domain representations of received data associated with each RX chain. Each spatial stream may be processed by a demodulation module 860. The demodulation module 860 may convert the frequency domain representations into a plurality of spatial streams. As a result, the demodulation module 860 may provide Nss spatial streams. A stream combiner 875 may reverse the process of the stream parser 820 of the transmitter. For example, the stream combiner 875 may combine bitstreams from multiple spatial streams to prepare encoded data bits for a decoding module 880. The decoding module 880 may decode the encoded bits. In some implementations, the decoding module 880 may implement error correction using redundancy bits in the encoded bits. An FEC codeword receiver buffer 870 may store a previous FEC codeword for subsequent use if the decoding module 880 does not successfully decode the codeword. After receiving additional parity bits, the decoding module 880 may obtain the stored FEC codeword from the FEC codeword receiver buffer 870 and reattempt to decode it using the additional parity bits. A retransmission protocol unit 885 may coordinate with the decoding module 880 to implement the retransmission protocol. For example, the retransmission protocol unit 885 may configure the decoding module 880 for use with additional parity bits and may negotiate the retransmission protocol parameters with the sending STA. A feedback module 895 may prepare a feedback message based on the retransmission protocol. A descrambler 890 may reverse the scrambling performed by the scrambler 810 and provide the data 899 to an upper layer of the receiving STA.

Figure 9:
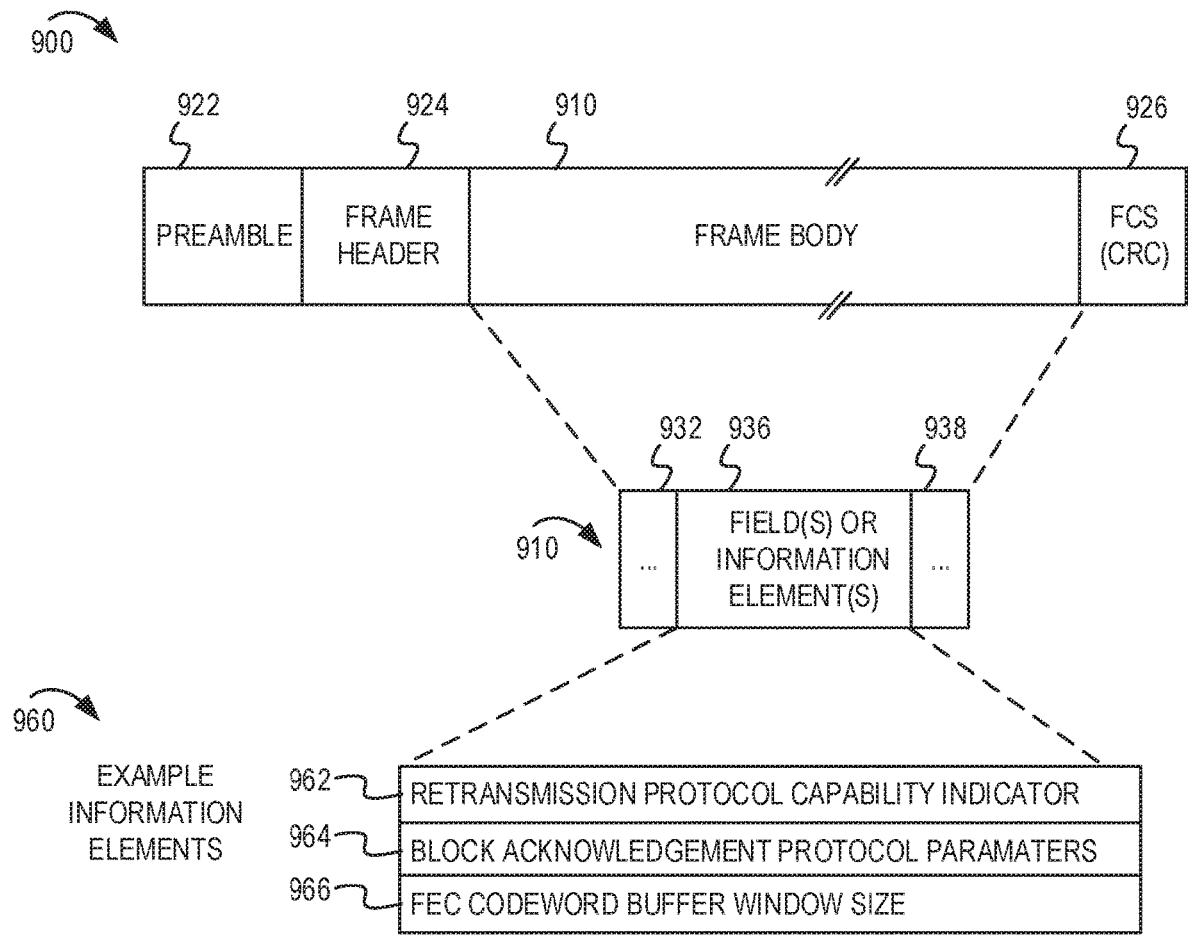
FIG. 9 depicts a conceptual diagram of an example configuration message for use with aspects of this disclosure.

FIG. 9 depicts a conceptual diagram of an example configuration message for use with aspects of this disclosure. For example, the example message 900 may be sent from a first WLAN device to a second WLAN device, or vice versa. The example message 900 may include a preamble 922, a header 924, a payload 910, and a frame check sequence (FCS) 926. The preamble 922 may include one or more bits to establish synchronization. The preamble 922 may be used, for example, when a dedicated discovery channel uses a listen-before-talk, contention-based access, or carrier sense access. In some implementations, if the dedicated discovery channel uses a scheduled timeslot for transmission, the preamble 922 may be omitted. The header 924 may include source and destination network addresses (such as the network address of the sending AP and receiving AP, respectively), the length of data frame, or other frame control information. In some implementations, the header 924 also may indicate a technology type associated with a technology-specific payload (if the payload 910 is specific to a particular technology type or types). The payload 910 may be used to convey the retransmission protocol parameters. The retransmission protocol parameters may be organized or formatted in a variety of ways. The payload 910 may be organized with a message format and may include information elements 932, 936, and 938. Several examples of information elements are illustrated in FIG. 9.

Example information elements 960 may be sent as part of a retransmission protocol configuration or setup message. The example information elements 960 may include initial (default) parameters for a retransmission protocol. In some implementations, the example information elements 960 may include a retransmission protocol capability indicator 962 (such as a HARQ capability indicator) to indicate that the STA supports the retransmission protocol features in this disclosure. The example information elements 960 may include block acknowledgement protocol parameters 964 or an FEC codeword buffer window size 966.

As described previously, the receiving STA may store codewords (encoded bits) for potential later decoding. However, the amount of memory available to store codewords may be limited. This disclosure provides at least two ways for the receiving STA to negotiate a window size with the sending STA.

In one example, when MAC layer block acknowledgement message (Block Ack) will be used, the receiving STA may adjust the block acknowledgement protocol parameters 964 to accommodate the receiver buffer memory size. For example, the receiving STA may adjust the BA window size (BA_win_size) or the maximum MPDU (max_MPDU_size) size, or both. The amount of memory in the receiver buffer could be calculated by multiple the BA_win_size and the max_MPDU_size.

In another example, a new configuration parameter (the FEC codeword buffer window size 966) may be defined. The FEC codeword buffer window size 966 (also referred to as an "FEC_win_size") may indicate the max number of bytes or codewords the receiver will store. In yet another example, the FEC_win_size can be included in an ADDBA response management frame used during the setup of the Block Ack procedure.

Figure 10:
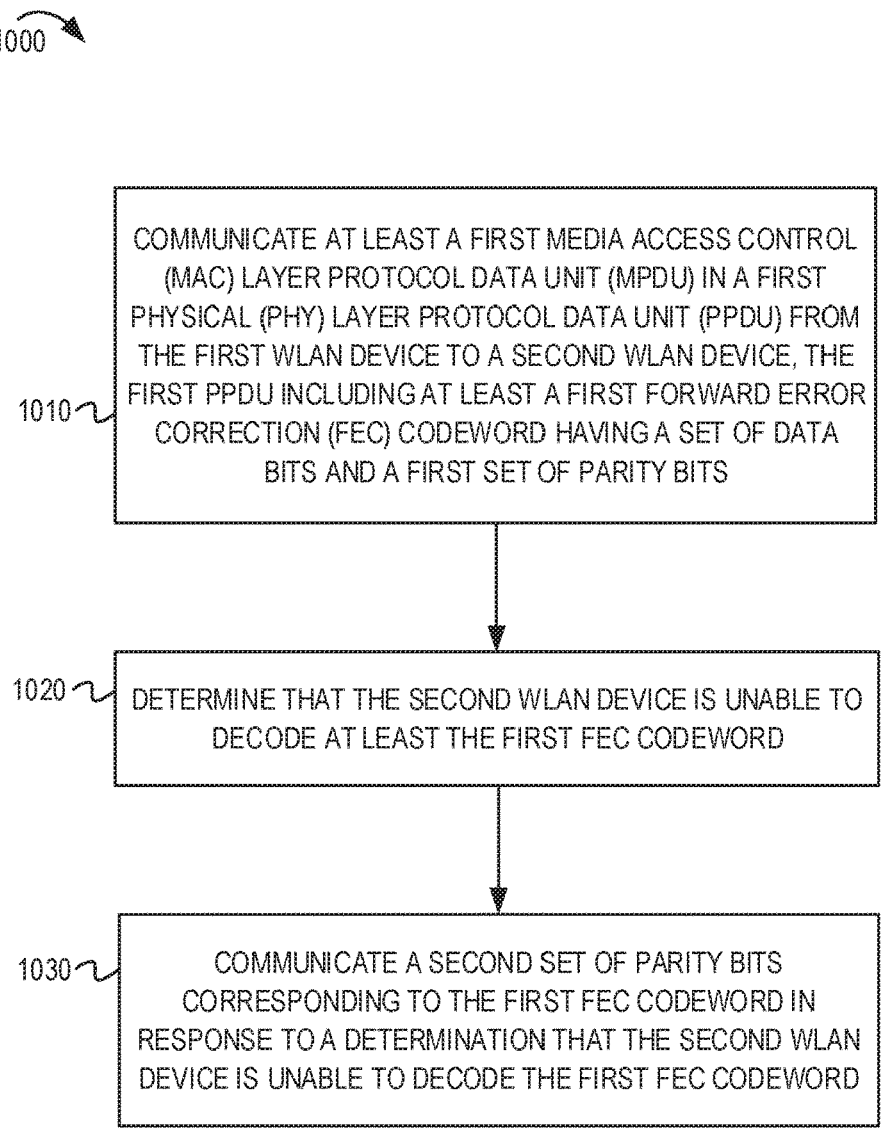
FIG. 10 depicts a flowchart with an example process for a sending STA implementing aspects of this disclosure.

FIG. 10 depicts a flowchart with an example process 1000 for a sending STA implementing aspects of this disclosure. The example operations may be performed by a first WLAN device (such as a sending STA). At block 1010, the first WLAN device may communicate at least a first MPDU in a first PPDU from the first WLAN device to a second WLAN device. The first PPDU may include at least a first FEC codeword having a set of data bits and a first set of parity bits. At block 1020, the first WLAN device may determine that the second WLAN device is unable to decode at least the first FEC codeword. At block 1030, the first WLAN device may communicate a second set of parity bits corresponding to the first FEC codeword in response to a determination that the second WLAN device is unable to decode the first FEC codeword.

In some implementations, the process may include communicating a retransmission protocol capability indicator to the second WLAN device to inform the second WLAN device that the first WLAN device is capable of communicating the second set of parity bits for use with a codeword-based hybrid automatic repeat request (HARM) retransmission protocol. The retransmission protocol capability indicator may be in a header of the first PPDU or in a configuration message.

In some implementations, the first WLAN device and the second WLAN device may negotiate an FEC codeword buffer window size. For example, the parameters for a block acknowledgement protocol may include a block acknowledgement window size and a maximum MPDU size. The FEC codeword buffer window size may be based on the parameters for the block acknowledgement protocol.

In some implementations, at block 1020, the first WLAN device may receive a MAC layer block acknowledgement message, a codeword block acknowledgement message, or a codeword-specific feedback message. The MAC layer block acknowledgement message may indicate MPDUs from the first PPDU that were not successfully decoded. The first WLAN device may determine which codewords failed based on the MAC layer block acknowledgement message and communicate additional parity bits for those failed codewords.

Figure 11:
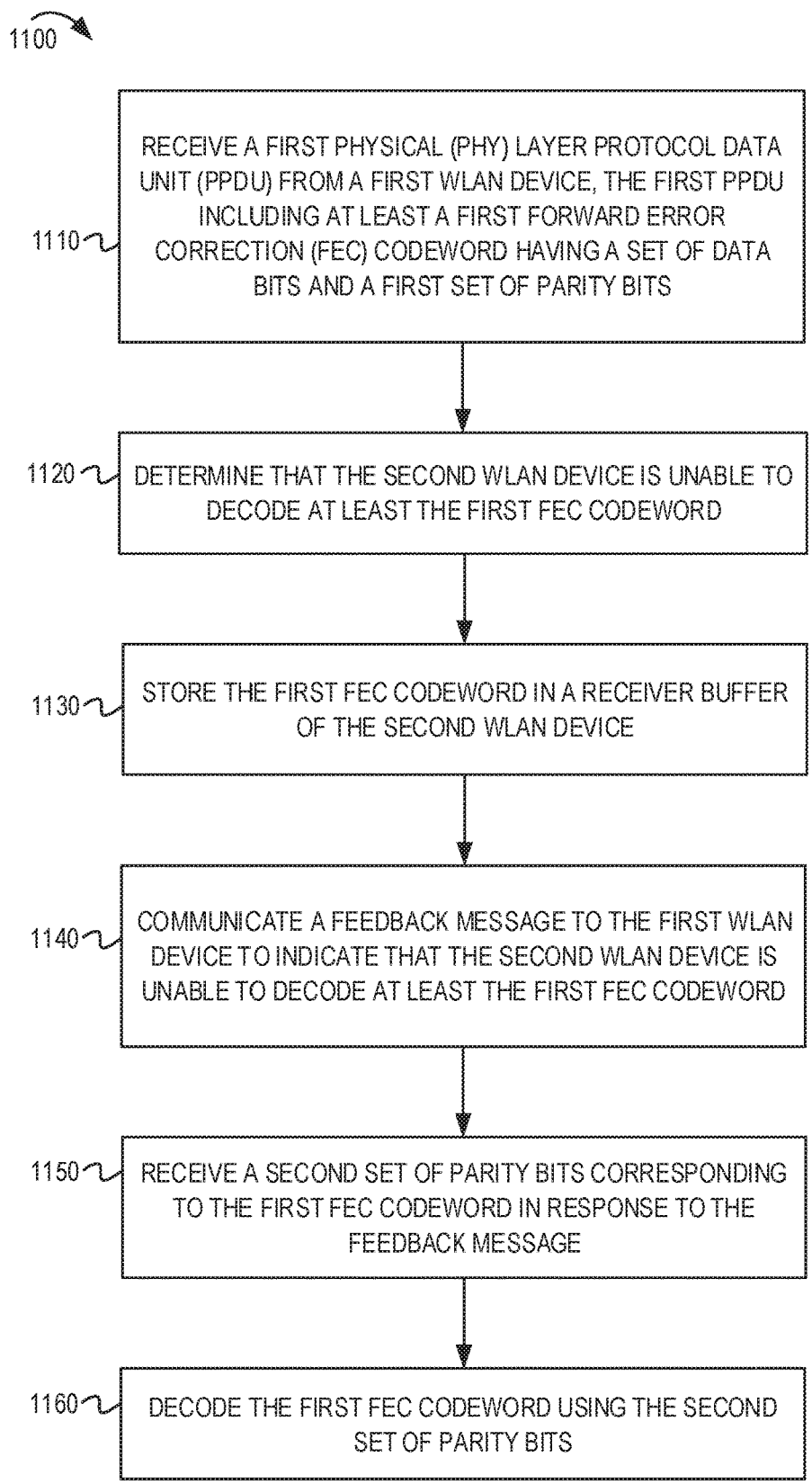
FIG. 11 depicts a flowchart with an example process for a receiving STA implementing aspects of this disclosure.

FIG. 11 depicts a flowchart with an example process 1100 for a receiving STA implementing aspects of this disclosure. The example operations may be performed by a second WLAN device (such as a receiving STA) that participates in a retransmission protocol with a first WLAN device. At block 1110, the second WLAN device may receive a first PPDU from a first WLAN device. The first PPDU may include at least a first FEC codeword having a set of data bits and a first set of parity bits. At block 1120, the second WLAN device may determine that the second WLAN device is unable to decode at least the first FEC codeword. At block 1130, the second WLAN device may store the first FEC codeword in a receiver buffer of the second WLAN device.

At block 1140, the second WLAN device may communicate a feedback message to the first WLAN device to indicate that the second WLAN device is unable to decode at least the first FEC codeword. For example, the feedback message may be a MAC layer block acknowledgement message, a codeword block acknowledgement message, or a codeword-specific feedback message.

At block 1150, the second WLAN device may receive a second set of parity bits corresponding to the first FEC codeword in response to the feedback message. For example, the second set of parity bits may be received in a parity MPDU included in a second PPDU. At block 1160, the second WLAN device may decode the first FEC codeword using the second set of parity bits.

Figure 12:
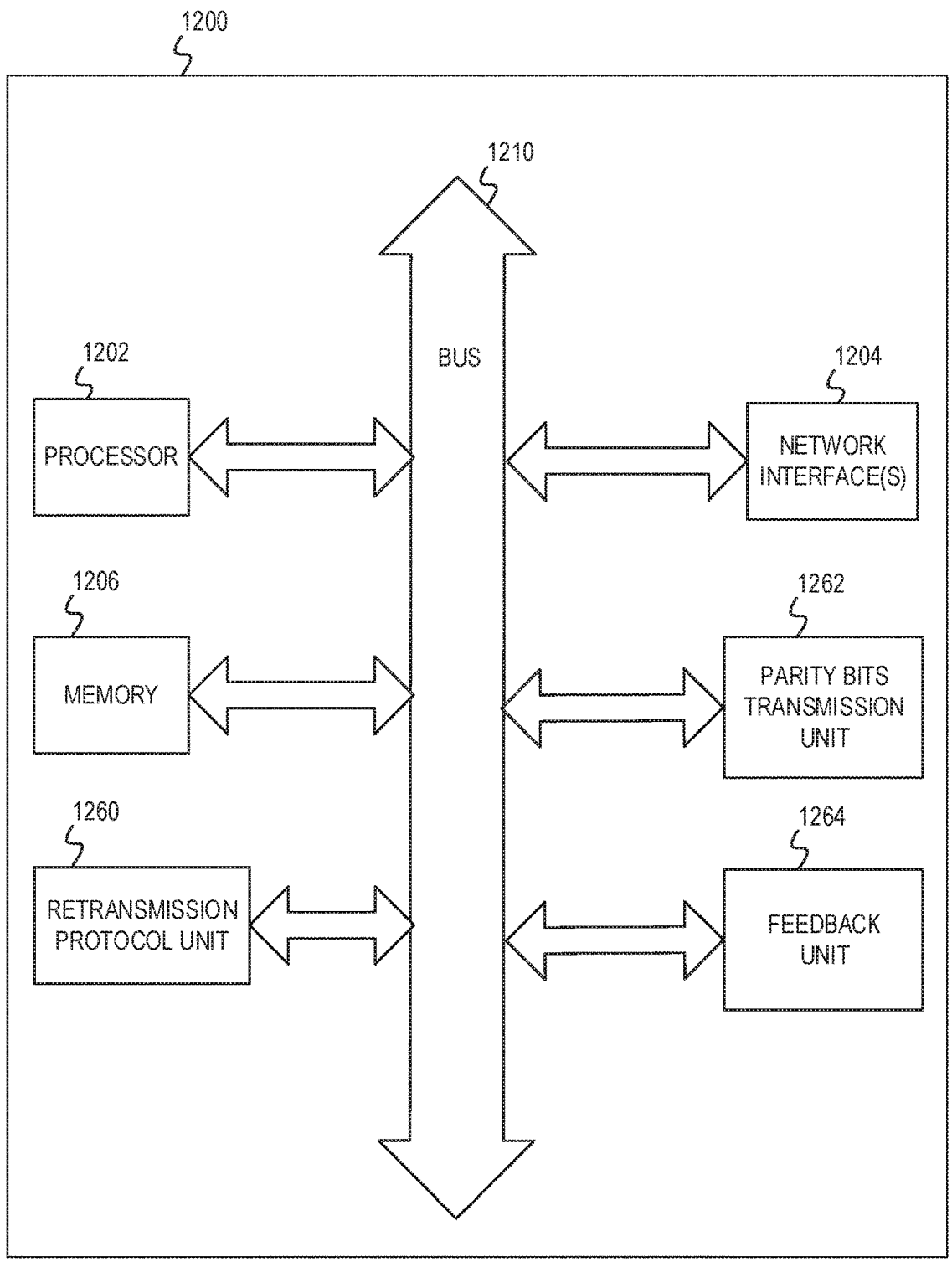
FIG. 12 shows a block diagram of an example electronic device for implementing aspects of this disclosure.

FIG. 12 shows a block diagram of an example electronic device for implementing aspects of this disclosure. In some implementations, the electronic device 1200 may be one of an access point (including any of the APs described herein), a range extender, or other electronic systems. The electronic device 1200 can include a processor 1202 (possibly including multiple processors, multiple cores, multiple nodes, or implementing multi-threading, etc.). The electronic device 1200 also can include a memory 1206. The memory 1206 may be system memory or any one or more of the possible realizations of computer-readable media described herein. The electronic device 1200 also can include a bus 1210 (such as PCI, ISA, PCI-Express, HyperTransport®, Infini-Band®, NuBus,® AHB, AXI, etc.), and a network interface 1204 that can include at least one of a wireless network interface (such as a WLAN interface, a Bluetooth® interface, a WiMAX® interface, a ZigBee® interface, a Wireless USB interface, etc.) and a wired network interface (such as an Ethernet interface, a powerline communication interface, etc.). In some implementations, the electronic device 1200 may support multiple network interfaces—each of which is configured to couple the electronic device 1200 to a different communication network.

The electronic device 1200 may include retransmission protocol unit 1260, a parity bits transmission unit 1262, and a feedback unit 1264. In some implementations, the retransmission protocol unit 1260, the parity bits transmission unit 1262, and the feedback unit 1264 may be distributed within the processor 1202, the memory 1206, and the bus 1210. The retransmission protocol unit 1260, the parity bits transmission unit 1262, and the feedback unit 1264 can perform some or all the operations described herein. For example, the retransmission protocol unit 1260 may be similar to the retransmission protocol unit 112 or the retransmission protocol unit 122 as described in FIG. 1. The parity bits transmission unit 1262 may be similar to the parity bits transmission unit 114 described in FIG. 1. The feedback unit 1264 may be similar to the HARQ feedback unit 124 described in FIG. 1. Depending on whether the electronic device 1200 is a sending STA or a receiving STA for a retransmission protocol, the electronic device 1200 may use either of the parity bits transmission unit 1262 or the feedback unit 1264 to perform the features described in this disclosure.

The memory 1206 can include computer instructions executable by the processor 1202 to implement the functionality of the implementations described in FIGS. 1-11. Any of these functionalities may be partially (or entirely) implemented in hardware or on the processor 1202. For example, the functionality may be implemented with an application specific integrated circuit, in logic implemented in the processor 1202, in a co-processor on a peripheral device or card, etc. Further, realizations may include fewer or additional components not illustrated in FIG. 12 (such as video cards, audio cards, additional network interfaces, peripheral devices, etc.). The processor 1202, the memory 1206, and the network interface 1204 are coupled to the bus 1210. Although illustrated as being coupled to the bus 1210, the memory 1206 may be coupled to the processor 1202.

FIGS. 1-12 and the operations described herein are examples meant to aid in understanding example implementations and should not be used to limit the potential implementations or limit the scope of the claims. Some implementations may perform additional operations, fewer operations, operations in parallel or in a different order, and some operations differently.

Another innovative aspect of the subject matter described in this disclosure can be implemented as a method performed by a first wireless local area network (WLAN) device. The method may include communicating at least a first media access control (MAC) layer protocol data unit (MPDU) in a first physical (PHY) layer protocol data unit (PPDU) from the first WLAN device to a second WLAN device. The first PPDU may include at least a first forward error correction (FEC) codeword having a set of data bits and a first set of parity bits. The method may include determining that the second WLAN device is unable to decode at least the first FEC codeword. The method may include communicating a second set of parity bits corresponding to the first FEC codeword in response to a determination that the second WLAN device is unable to decode the first FEC codeword.

Another innovative aspect of the subject matter described in this disclosure can be implemented in a first WLAN device. In some implementations, the first WLAN device includes a processor and memory coupled with the processor. The memory may have instructions stored therein which, when executed by the processor, cause the first WLAN device to perform features of the above method.

Another innovative aspect of the subject matter described in this disclosure can be implemented in a computer-readable medium having stored therein instructions which, when executed by a processor of a first WLAN device, causes the first WLAN device to perform features of the above method.

In some implementations, the methods, first WLAN device and computer-readable media may be configured to communicate a retransmission protocol capability indicator to the second WLAN device to inform the second WLAN device that the first WLAN device is capable of communicating the second set of parity bits for use with a codeword-based hybrid automatic repeat request (HARD) retransmission protocol.

In some implementations, the retransmission protocol capability indicator may be included in a header of the first PPDU.

In some implementations, the retransmission protocol capability indicator may be included in an initialization message for a block acknowledgement protocol.

In some implementations, the methods, first WLAN device and computer-readable media may be configured to determine an FEC codeword buffer window size that corresponds to an available memory of a receiver buffer at the second WLAN device.

In some implementations, the methods, first WLAN device and computer-readable media may be configured to determine parameters for a block acknowledgement protocol, the parameters including a block acknowledgement window size and a maximum MPDU size. In some implementations, the methods, first WLAN device and computer-readable media may be configured to determine the FEC codeword buffer window size base, at least in part, on the parameters for the block acknowledgement protocol.

In some implementations, the methods, first WLAN device and computer-readable media may be configured to receive a value indicating the FEC codeword buffer window size in an initialization message for a block acknowledgement protocol.

In some implementations, the methods, first WLAN device and computer-readable media may be configured to receive a MAC layer block acknowledgement message from the second WLAN device, the MAC layer block acknowledgement message indicating that the second WLAN device did not receive the first MPDU. In some implementations, the methods, first WLAN device and computer-readable media may be configured to determine that the first MPDU corresponds to the first FEC codeword of the first PPDU.

In some implementations, the methods, first WLAN device and computer-readable media may be configured to receive a codeword block acknowledgement message from the second WLAN device, the codeword block acknowledgement message indicating that the second WLAN device did not decode the first FEC codeword.

In some implementations, the methods, first WLAN device and computer-readable media may be configured to receive a codeword-specific feedback message from the second WLAN device, the codeword-specific feedback message indicating that the second WLAN device did not decode the first FEC codeword, wherein the codeword-specific feedback message includes information that uniquely identifies the first FEC codeword.

In some implementations, the methods, first WLAN device and computer-readable media may be configured to determine whether the second WLAN device has stored the first FEC codeword in a receiver buffer. In some implementations, the methods, first WLAN device and computer-readable media may be configured to determine to communicate the second set of parity bits based, at least in part, on a determination that the second WLAN device has stored the first FEC codeword in the receiver buffer.

In some implementations, the methods, first WLAN device and computer-readable media may be configured to receive a retransmission protocol capability indicator in at least one member selected from a group consisting of an initialization message for a block acknowledgement protocol, a MAC layer block acknowledgement message, a codeword block acknowledgement message, and a codeword-specific feedback message.

In some implementations, the first PPDU may include an address associated with the second WLAN device in a header of the first PPDU to cause the second WLAN device to buffer one or more FEC codewords from the first PPDU in a receiver buffer if the second WLAN device is unable to decode the one or more FEC codewords from the first PPDU.

In some implementations, the methods, first WLAN device and computer-readable media may be configured to determine that the first WLAN device has not received a block acknowledgement message from the second WLAN device. In some implementations, the methods, first WLAN device and computer-readable media may be configured to communicate a block acknowledgement request (BAR) message addressed to the second WLAN device to determine whether the second WLAN device has stored the first FEC codeword in a receiver buffer.

In some implementations, the BAR message is communicated using a robust encoding rate, and wherein the BAR message includes an identifier of the second WLAN device and a sequence number associated with the first PPDU.

In some implementations, the methods, first WLAN device and computer-readable media may be configured to determine the first FEC codeword using a low-density parity check (LDPC) encoder that generates parity-check bits based on the set of data bits and a first coding rate. In some implementations, the methods, first WLAN device and computer-readable media may be configured to determine the first set of parity bits by puncturing the parity-check bits generated by the LDPC encoder.

In some implementations, the second set of parity bits includes at least one of the punctured parity-check bits not included in the first set of parity bits.

In some implementations, the methods, first WLAN device and computer-readable media may be configured to determine the second set of parity bits using the LDPC encoder that generates parity-check bits based on the set of data bits and a second coding rate, wherein the second coding rate is different from the first coding rate.

In some implementations, the methods, first WLAN device and computer-readable media may be configured to communicate the second set of parity bits in a parity MPDU.

In some implementations, the parity MPDU may be encoded using a robust encoding scheme for reliable delivery to the second WLAN device.

In some implementations, the parity MPDU may include a type field that indicates the parity MPDU includes parity bits for one or more FEC codewords.

In some implementations, the type field may be included in either a header or an information element of the parity MPDU.

In some implementations, the parity MPDU may be communicated in a second PPDU from the first WLAN device to the second WLAN device. The second PPDU may include a header that indicates the second PPDU includes the parity MPDU.

In some implementations, the parity MPDU may include a sequence control field to indicate that the second set of parity bits corresponds to the first FEC codeword of the first PPDU.

In some implementations, the sequence control field may include at least one member selected from a group consisting of a sequence number of the first MPDU, a position of the first FEC codeword in the first PPDU, and an index value of the first FEC codeword from among a plurality of FEC codewords in the first PPDU.

In some implementations, the parity MPDU includes more than one set of parity bits, each set of parity bits for a different FEC codeword in the first PPDU that the second WLAN device was unable to decode.

In some implementations, the parity MPDU may be formed in an aggregate MPDU (AMPDU) transmission that includes multiple MPDUs, each MPDU for a different set of parity bits corresponding to a different FEC codeword in the first PPDU that the second WLAN device was unable to decode.

In some implementations, each MPDU may include an indicator of which FEC codeword is represented by the set of parity bits included in that MPDU.

Another innovative aspect of the subject matter described in this disclosure can be implemented as a method performed by a second WLAN device for implementing a HARQ protocol. The method may include receiving a first physical (PHY) layer protocol data unit (PPDU) from a first WLAN device, the first PPDU including at least a first forward error correction (FEC) codeword having a set of data bits and a first set of parity bits. The method may include determining that the second WLAN device is unable to decode at least the first FEC codeword. The method may include storing the first FEC codeword in a receiver buffer of the second WLAN device. The method may include communicating a feedback message to the first WLAN device to indicate that the second WLAN device is unable to decode at least the first FEC codeword. The method may include receiving a second set of parity bits corresponding to the first FEC codeword in response to the feedback message. The method may include decoding the first FEC codeword using the second set of parity bits.

Another innovative aspect of the subject matter described in this disclosure can be implemented in a second WLAN device. In some implementations, the second WLAN device includes a processor and memory coupled with the processor. The memory may have instructions stored therein which, when executed by the processor, cause the second WLAN device to perform features of the above method.

Another innovative aspect of the subject matter described in this disclosure can be implemented in a computer-readable medium having stored therein instructions which, when executed by a processor of a second WLAN device, causes the second WLAN device to perform features of the above method.

In some implementations, the methods, second WLAN device and computer-readable media may be configured to In some implementations, the methods, second WLAN device and computer-readable media may be configured to communicate a retransmission protocol capability indicator to the first WLAN device to inform the first WLAN device that the second WLAN device is capable of receiving the second set of parity bits for use with a codeword-based hybrid automatic repeat request (HARD) retransmission protocol.

In some implementations, the retransmission protocol capability indicator is included in at least one member selected from a group consisting of an initialization message for a block acknowledgement protocol, a MAC layer block acknowledgement message, a codeword block acknowledgement message, and a codeword-specific feedback message.

In some implementations, the methods, second WLAN device and computer-readable media may be configured to determine that the second WLAN device is unable to decode any FEC codewords in the first PPDU. In some implementations, the methods, second WLAN device and computer-readable media may be configured to store the FEC codewords in the receiver buffer of the second WLAN device. In some implementations, the methods, second WLAN device and computer-readable media may be configured to communicate a block acknowledgement message to the first WLAN device even though the second WLAN device is unable to decode any FEC codewords in the first PPDU, wherein the block acknowledgement message causes the first WLAN device to transmit additional parity bits for each of the FEC codewords.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits, and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described throughout. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and Blu-ray™ disc where disks usually reproduce data magnetically, while discs reproduce data optically with lasers. Combinations also can be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example process in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method for wireless communication by a first wireless local area network (WLAN) device, comprising:
    determining that a second WLAN device supports a hybrid automatic repeat request (HARQ) retransmission protocol for managing retransmissions in a wireless local area network;
    transmitting, from the first WLAN device to the second WLAN device, an initial HARQ transmission of at least a first media access control (MAC) layer protocol data unit (MPDU), the initial HARQ transmission including at least a first forward error correction (FEC) codeword having a first set of data bits and a first set of parity bits;
    determining that the second WLAN device is unable to decode at least the first FEC codeword; and
    transmitting a HARQ retransmission from the first WLAN device to a second WLAN device in accordance with the HARQ retransmission protocol, the HARQ retransmission including at least a second set of parity bits corresponding to the first FEC codeword in response to a determination that the second WLAN device is unable to decode the first FEC codeword.

2. The method of claim 1, further comprising:
    transmitting a HARQ retransmission policy from the first WLAN device to the second WLAN device.

3. The method of claim 1, further comprising:
    transmitting a HARQ capability indicator to the second WLAN device to inform the second WLAN device that the first WLAN device supports the HARQ retransmission protocol.

4. The method of claim 3, wherein the initial HARQ transmission is included in a first physical (PHY) layer protocol data unit (PPDU), and wherein the HARQ capability indicator is included in a header of the first PPDU.

5. The method of claim 3, wherein the HARQ capability indicator is included in an initialization message for a block acknowledgement protocol.

6. The method of claim 1, wherein determining that the second WLAN supports the HARQ retransmission protocol includes receiving a HARQ capability indicator in at least one member selected from a group consisting of an initialization message for a block acknowledgement protocol, a MAC layer block acknowledgement message, a codeword block acknowledgement message, and a codeword-specific feedback message.

7. The method of claim 1, further comprising:
    determining an FEC codeword buffer window size that corresponds to an available memory of a receiver buffer at the second WLAN device.

8. The method of claim 7, wherein determining the FEC codeword buffer window size includes:
    determining parameters for a block acknowledgement protocol, the parameters including a block acknowledgement window size and a maximum MPDU size; and
    determining the FEC codeword buffer window size based, at least in part, on the parameters for the block acknowledgement protocol.

9. The method of claim 7, wherein determining the FEC codeword buffer window size includes:

receiving a value indicating the FEC codeword buffer window size in an initialization message for a block acknowledgement protocol.

10. The method of claim 1, wherein determining that the second WLAN device is unable to decode at least the first FEC codeword includes:
receiving a MAC layer block acknowledgement message from the second WLAN device, the MAC layer block acknowledgement message indicating that the second WLAN device did not receive the first MPDU; and
determining that the first MPDU corresponds to the first FEC codeword.

11. The method of claim 1, wherein determining that the second WLAN device is unable to decode at least the first FEC codeword includes:
receiving a codeword block acknowledgement message from the second WLAN device, the codeword block acknowledgement message indicating that the second WLAN device did not decode the first FEC codeword.

12. The method of claim 11, wherein the codeword block acknowledgement message includes a bitmap in which one bit uniquely identifies the first FEC codeword.

13. The method of claim 1, wherein the initial HARQ transmission is included in a first physical (PHY) layer protocol data unit (PPDU), wherein the first PPDU includes a HARQ indicator in a header of the first PPDU to cause the second WLAN device to buffer one or more FEC codewords from the first PPDU in a receiver buffer when the second WLAN device is unable to decode the one or more FEC codewords from the first PPDU.

14. The method of claim 1, wherein determining that the second WLAN device is unable to decode at least the first FEC codeword includes:
determining that the first WLAN device has not received a block acknowledgement message from the second WLAN device; and
transmitting a block acknowledgement request (BAR) message addressed to the second WLAN device, the BAR message including one or more codeword identifier that indicate that the first WLAN device has transmitted the first FED codeword in the initial HARQ transmission.

15. The method of claim 1, wherein the HARQ retransmission is encoded using a robust encoding scheme for reliable delivery to the second WLAN device.

16. The method of claim 1, wherein the HARQ retransmission is included in a second MPDU, and wherein the second MPDU includes a type field that indicates the second MPDU includes the HARQ retransmission.

17. The method of claim 16, wherein the type field is included in either a header or an information element of the second MPDU.

18. The method of claim 16, wherein the second MPDU includes a sequence control field to indicate that the second set of parity bits corresponds to the first FEC codeword.

19. The method of claim 1, wherein the HARQ retransmission is transmitted in a physical (PHY) layer protocol data unit (PPDU) from the first WLAN device to the second WLAN device, and wherein the PPDU includes a header that indicates the PPDU includes the HARQ retransmission.

20. The method of claim 19, wherein the HARQ retransmission includes a sequence control field that identifies which FEC codewords are retransmitted in the second MPDU.

21. The method of claim 1, wherein the HARQ retransmission includes more than one set of parity bits, each set of parity bits for a different FEC codeword in the HARQ initial transmission that the second WLAN device was unable to decode.

22. The method of claim 21, wherein the HARQ retransmission is included in a parity MPDU, and the parity MPDU is formed in an aggregate MPDU (AMPDU) transmission that includes multiple MPDUs that include at least the parity MPDU.

23. The method of claim 22, wherein the AMPDU transmission includes the parity MPDU and an initial HARQ transmission of a second MPDU.

24. The method of claim 22, wherein each MPDU includes a HARQ indicator to indicate whether or not the MPDU is a HARQ retransmission.

25. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to:
determine that a second WLAN device supports a hybrid automatic repeat request (HARQ) retransmission protocol for managing retransmissions in a wireless local area network;
transmit, from the first WLAN device to the second WLAN device, an initial HARQ transmission of at least a first media access control (MAC) layer protocol data unit (MPDU), the initial HARQ transmission including at least a first forward error correction (FEC) codeword having a first set of data bits and a first set of parity bits;
determine that the second WLAN device is unable to decode at least the first FEC codeword; and
transmit a HARQ retransmission from the first WLAN device to a second WLAN device in accordance with the HARQ retransmission protocol, the HARQ retransmission including at least a second set of parity bits corresponding to the first FEC codeword in response to a determination that the second WLAN device is unable to decode the first FEC codeword.

26. The wireless communication device of claim 25, wherein the processor-readable code, when executed by the at least one processor in conjunction with the at least one modem, is further configured to transmit a HARQ capability indicator to the second WLAN device to inform the second WLAN device that the first WLAN device supports the HARQ retransmission protocol.

27. The wireless communication device of claim 26, wherein the initial HARQ transmission is included in a first physical (PHY) layer protocol data unit (PPDU), and wherein the retransmission protocol capability indicator is included in a header of the first PPDU.

28. The wireless communication device of claim 26, wherein the HARQ capability indicator is included in an initialization message for a block acknowledgement protocol.

29. The wireless communication device of claim 25, wherein the initial HARQ transmission is included in a first physical (PHY) layer protocol data unit (PPDU), wherein the first PPDU includes a HARQ indicator in a header of the first PPDU to cause the second WLAN device to buffer one or more FEC codewords from the first PPDU in a receiver buffer when the second WLAN device is unable to decode the one or more FEC codewords from the first PPDU.

30. An apparatus comprising:
a wireless communication device comprising:
   at least one modem;
   at least one processor communicatively coupled with the at least one modem; and
   at least one memory communicatively coupled with the at least one processor and storing processor-readable code that, when executed by the at least one processor in conjunction with the at least one modem, is configured to:
determine that a second WLAN device supports a hybrid automatic repeat request (HARQ) retransmission protocol for managing retransmissions in a wireless local area network;
transmit, from the first WLAN device to the second WLAN device, an initial HARQ transmission of at least a first media access control (MAC) layer protocol data unit (MPDU), the initial HARQ transmission including at least a first forward error correction (FEC) codeword having a first set of data bits and a first set of parity bits;
determine that the second WLAN device is unable to decode at least the first FEC codeword; and
transmit a HARQ retransmission from the first WLAN device to a second WLAN device in accordance with the HARQ retransmission protocol, the HARQ retransmission including at least a second set of parity bits corresponding to the first FEC codeword in response to a determination that the second WLAN device is unable to decode the first FEC codeword;
at least one transceiver coupled to the at least one modem;
at least one antenna coupled to the at least one transceiver to wirelessly transmit signals output from the at least one transceiver and to wirelessly receive signals for input into the at least one transceiver; and
a housing that encompasses the at least one modem, the at least one processor, the at least one memory, the at least one transceiver and at least a portion of the at least one antenna.

* * * * *